(12) United States Patent
Kato

(10) Patent No.: US 12,075,177 B2
(45) Date of Patent: Aug. 27, 2024

(54) SEMICONDUCTOR DEVICE, IMAGING ELEMENT, AND ELECTRONIC DEVICE

(71) Applicant: SONY SEMICONDUCTOR SOLUTIONS CORPORATION, Kanagawa (JP)

(72) Inventor: Atsushi Kato, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 144 days.

(21) Appl. No.: 17/756,245

(22) PCT Filed: Oct. 14, 2020

(86) PCT No.: PCT/JP2020/038703
§ 371 (c)(1),
(2) Date: May 19, 2022

(87) PCT Pub. No.: WO2021/106402
PCT Pub. Date: Jun. 3, 2021

(65) Prior Publication Data
US 2023/0007202 A1    Jan. 5, 2023

(30) Foreign Application Priority Data
Nov. 29, 2019 (JP) .................. 2019-217411

(51) Int. Cl.
*H04N 25/75* (2023.01)
*H01L 23/00* (2006.01)
(Continued)

(52) U.S. Cl.
CPC ............ *H04N 25/75* (2023.01); *H01L 24/08* (2013.01); *H01L 27/14634* (2013.01);
(Continued)

(58) Field of Classification Search
CPC ...... H04N 25/75; H04N 17/002; H04N 25/77; H04N 25/79; H04N 25/69; H04N 25/766;
(Continued)

(56) References Cited

U.S. PATENT DOCUMENTS

2003/0151686 A1    8/2003    Eiji
2016/0351606 A1   12/2016    Azami et al.
(Continued)

FOREIGN PATENT DOCUMENTS

JP    2003-244547 A    8/2003
JP    2015-153962 A    8/2015
(Continued)

OTHER PUBLICATIONS

International Search Report and Written Opinion of PCT Application No. PCT/JP2020/038703, issued on Dec. 15, 2020, 08 pages of ISRWO.

*Primary Examiner* — Twyler L Haskins
*Assistant Examiner* — Angel L Garces-Rivera
(74) *Attorney, Agent, or Firm* — CHIP LAW GROUP

(57) ABSTRACT

Provided is a semiconductor device including a first charge accumulation unit capable of accumulating a charge, a first initialization unit that is connected to the first charge accumulation unit and initializes the first charge accumulation unit; and a first voltage switching unit that is connected to the first initialization unit and is capable of selectively supplying a first voltage and a second voltage different from the first voltage to the first initialization unit.

18 Claims, 16 Drawing Sheets

(51) Int. Cl.
*H01L 27/146* (2006.01)
*H04N 17/00* (2006.01)
*H04N 25/77* (2023.01)
*H04N 25/79* (2023.01)

(52) U.S. Cl.
CPC ........... *H04N 17/002* (2013.01); *H04N 25/77* (2023.01); *H04N 25/79* (2023.01); *H01L 24/16* (2013.01); *H01L 24/32* (2013.01); *H01L 24/73* (2013.01); *H01L 2224/08145* (2013.01); *H01L 2224/16145* (2013.01); *H01L 2224/32145* (2013.01); *H01L 2224/73204* (2013.01)

(58) Field of Classification Search
CPC ... H04N 25/70; H01L 24/08; H01L 27/14634; H01L 24/16; H01L 24/32; H01L 24/73; H01L 2224/08145; H01L 2224/16145; H01L 2224/32145; H01L 2224/73204; H01L 24/80; H01L 21/822; H01L 27/04; H01L 27/146; H01L 27/14609
See application file for complete search history.

(56) References Cited

U.S. PATENT DOCUMENTS

2017/0187972 A1    6/2017  Murao
2019/0067612 A1*   2/2019  Tashiro ............... H01L 27/1461

FOREIGN PATENT DOCUMENTS

| JP | 2016-213286 A | 12/2016 |
| JP | 2017-120973 A | 7/2017 |
| JP | 2019-146071 A | 8/2019 |
| WO | 2019/163511 A1 | 8/2019 |

\* cited by examiner

SEMICONDUCTOR DEVICE, IMAGING ELEMENT, AND ELECTRONIC DEVICE

CROSS REFERENCE TO RELATED APPLICATIONS

This application is a U.S. National Phase of International Patent Application No. PCT/JP2020/038703 filed on Oct. 14, 2020, which claims priority benefit of Japanese Patent Application No. JP 2019-217411 filed in the Japan Patent Office on Nov. 29, 2019. Each of the above-referenced applications is hereby incorporated herein by reference in its entirety.

FIELD

The present disclosure relates to a semiconductor device, an imaging element, and an electronic device.

BACKGROUND

In recent years, imaging elements including photoelectric conversion films which are sensitive to light in an infrared region have attracted attention. For example, one of such imaging elements includes: a photoelectric conversion unit that includes a photoelectric conversion film formed using a group III-V compound semiconductor, such as indium gallium arsenide (InGaAs), and photoelectrically converts incident light to generate a charge; and a semiconductor device that is joined to the photoelectric conversion unit, reads out the charge as a signal, and performs predetermined signal processing on the read signal. This semiconductor device is sometimes referred to as a readout integrated circuit (ROIC) substrate.

CITATION LIST

Patent Literature

Patent Literature 1: JP 2016-213286 A

SUMMARY

Technical Problem

When evaluation (an operation test) of the above imaging element is performed, it is sometimes difficult to determine whether a defect occurs in the photoelectric conversion unit or the ROIC substrate even if the defect is found. If evaluation is performed to discover a defect in the ROIC substrate, it is necessary to perform such evaluation before the photoelectric conversion unit and the ROIC substrate are joined.

Regarding a test of an integrated circuit, a method of measuring a leakage current between well regions formed in a semiconductor substrate is disclosed in, for example, Patent Literature 1. However, Patent Literature 1 has no mention regarding evaluation of the ROIC substrate used with the photoelectric conversion unit and evaluation of the imaging element.

In view of the above circumstances, the present disclosure provides a readout semiconductor device that enables circuit evaluation regardless of the presence or absence of a photoelectric conversion unit, and an imaging element and an electronic device including the same.

Solution to Problem

According to the first embodiment of the present disclosure, a semiconductor device is provided that includes: a first charge accumulation unit capable of accumulating a charge; a first initialization unit that initializes the first charge accumulation unit; and a voltage switching unit that is capable of selectively supplying a first voltage and a second voltage different from the first voltage to the first initialization unit.

According to the second embodiment of the present disclosure, an imaging element is provided that includes: a photoelectric conversion unit that receives light and photoelectrically converts the received light to generate a charge; a first charge accumulation unit capable of accumulating the charge; a first initialization unit that is connected to the first charge accumulation unit and initializes the first charge accumulation unit; and a voltage switching unit that is connected to the first initialization unit and is capable of selectively supplying a first voltage and a second voltage different from the first voltage to the first initialization unit.

According to the third embodiment of the present disclosure, an imaging element is provided that includes: a first charge accumulation unit capable of accumulating a charge; a first initialization unit that is connected to the first charge accumulation unit and initializes the first charge accumulation unit; a photoelectric conversion unit that receives light and photoelectrically converts the received light to generate a charge; a second charge accumulation unit capable of accumulating the charge generated by the photoelectric conversion unit and transferring the accumulated charge to the first charge accumulation unit; a second initialization unit that is connected to the second charge accumulation unit and initializes the second charge accumulation unit; and a voltage switching unit that is connected to the first initialization unit and the second initialization unit and is capable of selectively supplying a first voltage and a second voltage different from the first voltage to the first initialization unit and the second initialization unit.

According to the fourth embodiment of the present disclosure, an electronic device is provided that includes: an optical system; a photoelectric conversion unit that receives light from the optical system and photoelectrically converts the received light to generate a charge; a first charge accumulation unit capable of accumulating the charge; a first initialization unit that is connected to the first charge accumulation unit and initializes the first charge accumulation unit; and a voltage switching unit that is connected to the first initialization unit and is capable of selectively supplying a first voltage and a second voltage different from the first voltage to the first initialization unit.

DESCRIPTION OF EMBODIMENTS

Hereinafter, exemplary embodiments of the present disclosure, which are not restrictive, will be described with reference to the attached drawings. Note that the same or corresponding parts or components will be denoted by the same or corresponding reference signs in each of the following embodiments, and the redundant description thereof will be omitted. In addition, the drawings are not intended to represent components or circuit elements or a relative ratio between thicknesses of various layers. Therefore, specific dimensions and thicknesses need to be determined by those skilled in the art in light of the following unrestrictive embodiments.

First Embodiment

[Configuration of Imaging Element According to First Embodiment]

Figure 1:
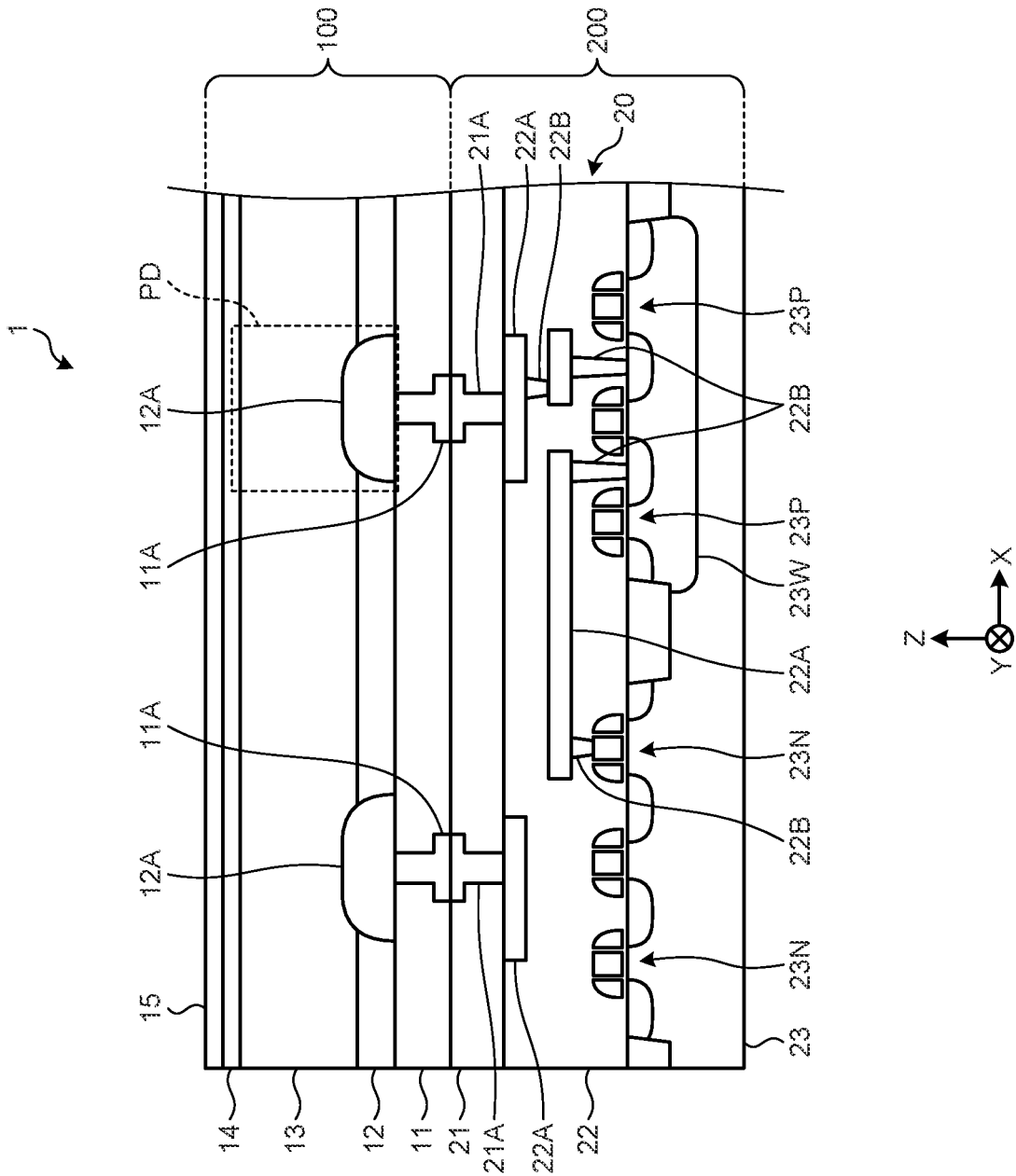
FIG. 1 is a partial cross-sectional view schematically illustrating an imaging element according to a first embodiment.

An imaging element according to a first embodiment of the present disclosure will be described with reference to FIG. 1. FIG. 1 is a partial cross-sectional view schematically illustrating the imaging element according to the first embodiment. As illustrated, an imaging element 1 includes a photoelectric conversion unit 100 and a readout integrated circuit (ROIC) substrate 200. The photoelectric conversion unit 100 receives light and photoelectrically converts the received light to generate a charge signal. The ROIC substrate 200 is joined to the photoelectric conversion unit 100 and reads out the charge signal generated by the photoelectric conversion unit 100. The ROIC substrate 200 corresponds to a semiconductor device according to one embodiment of the present disclosure.

<Configuration of Photoelectric Conversion Unit>

The photoelectric conversion unit 100 includes an insulating layer 11, a contact layer 12, a photoelectric conversion film 13, an upper electrode layer 14, and a transparent electrode layer 15.

The insulating layer 11 is made of an insulating material such as silicon oxide (SiOx) and silicon nitride (SiN). The insulating layer 11 is provided with a plurality of lower electrodes 11A penetrating through the insulating layer 11 in the up-down direction (Z direction in the drawing) The lower electrode 11A is formed using metal such as copper (Cu).

The contact layer 12 is formed using indium phosphorus (InP) in the present embodiment. Zinc (Zn) is added to the contact layer 12, so that the contact layer 12 has a p-type conductivity type. In addition, the contact layer 12 is provided with a plurality of diffusion regions 12A in which Zn is locally diffused at a high concentration. The plurality of diffusion regions 12A are arranged in a matrix in an X-Y plane defined by an X direction and a Y direction illustrated in the drawing. The lower electrodes 11A are provided to correspond to the plurality of diffusion regions 12A and electrically connected to the corresponding diffusion regions 12A.

The photoelectric conversion film 13 can be formed using a group III-V compound semiconductor. In the present embodiment, the photoelectric conversion film 13 is formed using non-doped indium gallium arsenide (InGaAs). InGaAs can have different wavelength sensitivity regions depending on a ratio x of In to Ga in $In_xGa_{(1-x)}As$ (x: 0<x≤1). In the present embodiment, the ratio x of In is set to 0.53 due to lattice matching with the contact layer 12 and the upper electrode layer (to be described later) which are formed using InP. An InGaAs energy band gap in the ratio of In is about 0.728 eV, which corresponds to about 1.7 μm when converted into a wavelength. The above photoelectric conversion film 13 can generally have sensitivity to wavelengths from 0.8 μm to 1.7 μm. Note that the photoelectric conversion film 13 may be formed using, for example, other group III-V compound semiconductors such as indium arsenide antimony (InAsSb), indium arsenide (InAs), and indium antimony (InSb), or a group II-VI compound semiconductor such as mercury cadmium telluride (HgCdTe) without being limited to InGaAs. In addition, the photoelectric conversion film 13 can also be formed using a compound semiconductor having a chalcopyrite structure such as CuGaInS mixed crystals, CuAlGaInS mixed crystals, CuAlGaInSSe mixed crystals. Further, the photoelectric conversion film 13 may be formed using element semiconductors such as silicon (Si), amorphous silicon (α-Si), and germanium (Ge). Furthermore, the photoelectric conversion film 13 may be a quantum dot photoelectric conversion film, an organic photoelectric conversion film, and the like.

The upper electrode layer 14 is formed on the photoelectric conversion film 13. The upper electrode layer 14 is formed using InP in the present embodiment. An n-type impurity, such as sulfur (S) and selenium (Se), is added to the upper electrode layer 14, so that the upper electrode layer 14 has an n-type conductivity type.

The transparent electrode layer 15 is formed on the upper electrode layer 14. The transparent electrode layer 15 can be formed using, for example, indium tin oxide (ITO), zinc oxide (ZnO), and the like In the photoelectric conversion unit 100 having the above configuration, a photodiode PD is formed by the diffusion region 12A ($p^+$-InP), the photoelectric conversion film 13 (non-doped InGaAs) on the diffusion region 12A, and the upper electrode layer 14 (N—InP) on the photoelectric conversion film 13. In the present embodiment, one photodiode PD corresponds to one pixel. Since the plurality of diffusion regions 12A are arranged in a matrix, the photodiodes PD and the pixels are also arranged in a matrix.

<Operation of Photoelectric Conversion Unit>

When light is incident on the photoelectric conversion film 13 of the photodiode PD through the transparent electrode layer 15 and the upper electrode layer 14 in the photoelectric conversion unit 100, an electron-hole pair is generated in the photoelectric conversion film 13. At this time, when a reverse bias voltage is applied to the photodiode PD, a large potential gradient is generated in the photoelectric conversion film 13 so that the generated electron and hole are separated. That is, the electron reaches the upper electrode layer 14, and the hole moves to the diffusion region 12A of the contact layer 12. In this manner, the charge signal corresponding to the incident light is read out by the readout integrated circuit 200 through the lower electrode 11A.

<Configuration of ROIC Substrate>

The ROIC substrate 200 is a so-called multilayer wiring board and includes an upper insulating layer 21, a lower insulating layer 22, and a silicon layer 23.

The upper insulating layer 21 is made of an insulating material such as silicon oxide (SiOx) and silicon nitride (SiN). The upper insulating layer 21 is provided with a plurality of connection electrodes 21A penetrating through the upper insulating layer 21 in the up-down direction. The connection electrode 21A is formed using metal such as copper (Cu). The connection electrodes 21A are electrically connected to the lower electrodes 11A of the photoelectric conversion unit 100 with a one-to-one relationship. This connection enables the charge signal from the photoelectric conversion unit 100 to be transmitted to the ROIC substrate 200. Note that the electric connection between the connection electrode 21A and the lower electrode 11A can be realized by directly joining the both. In addition, the connection electrode 21A and the lower electrode 11A may be electrically connected via a metal bump, and the like The photoelectric conversion unit 100 and the ROIC substrate 200 are integrated by joining the connection electrode 21A to the lower electrode 11A.

The lower insulating layer 22 is made of an insulating material, for example, silicon oxide (SiOx) and silicon nitride (SiN) similarly to the upper insulating layer 21. A plurality of wirings 22A and a plurality of vias 22B are buried in the lower insulating layer 22.

In the silicon layer 23, a plurality of metal oxide semiconductor (MOS) transistors 23N and 23P are formed on an interface side between the silicon layer 23 and the lower insulating layer 22. The silicon layer 23 is made of p-type silicon in the present embodiment. A well region 23W formed using n-type silicon is provided in a part of the silicon layer 23. Therefore, the MOS transistor 23P formed in the well region 23W is a P-channel MOS transistor, and the other MOS transistor 23N is an N-channel MOS transistor. The MOS transistors 23N and 23P are electrically connected to the wiring 22A and the via 22B in the lower insulating layer 22 appropriately, thereby forming a pixel readout circuit 20 that reads out the charge signal from the photodiode PD (pixel) of the photoelectric conversion unit 100.

In addition, the ROIC substrate 200 can include a load transistor unit, a comparator circuit unit, and a counter unit as will be described later. Further, the ROIC substrate 200 can also include a vertical scanning circuit, a horizontal scanning circuit, and an interface circuit for external equipment, and the like <Circuit Layout of Imaging Element>

Figure 2:
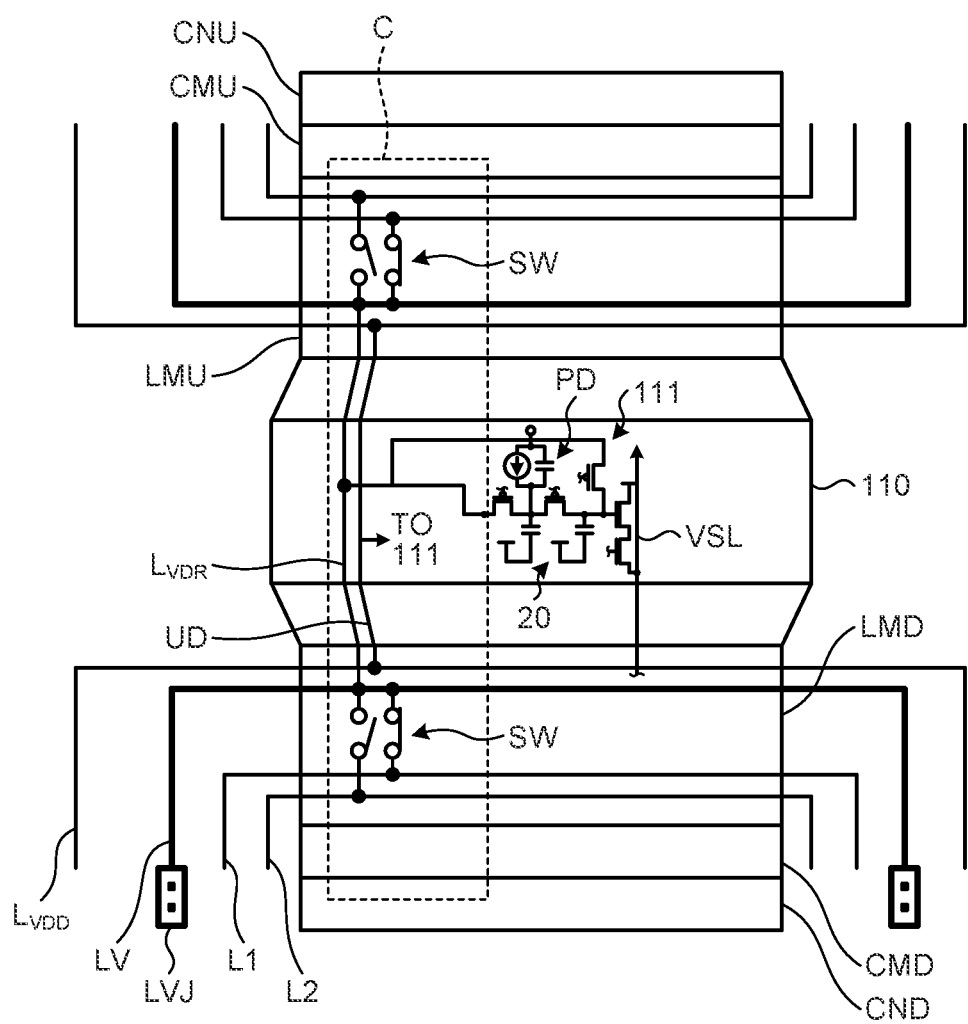
FIG. 2 is a schematic diagram illustrating an example of a circuit layout of the imaging element according to the first embodiment.

Next, the overall circuit layout of the imaging element 1 according to the present embodiment will be described with reference to FIG. 2. FIG. 2 is a schematic diagram illustrating an example of the circuit layout of the imaging element 1 according to the present embodiment. As illustrated in the drawing, the imaging element 1 includes a pixel array 110, load transistor units LMU and LMD, comparator circuit units CMU and CM, and counter units CNU and CND. In addition, the imaging element 1 includes a horizontal scanning circuit and a vertical scanning circuit (none of which are illustrated).

A plurality of pixels 111 are arrayed in a matrix in the pixel array 110 (one of the plurality of pixels 111 is illustrated in FIG. 2 for convenience of the description). The pixel 111 includes the photodiode PD formed in the photoelectric conversion unit 100 (FIG. 1) and the pixel readout circuit 20 formed in the ROIC substrate 200. In addition, the pixel array 110 is provided with vertical signal lines VSL outputting signals from the pixels 111. A plurality of the pixels 111 (plurality of pixels 111 in a column direction) arrayed in a column in the vertical direction in the drawing are electrically connected to one vertical signal line VSL among the plurality of pixels 111 arrayed in the matrix. That is, the vertical signal lines VSL are provided for the plurality of pixels 111 in the column direction, and the number of columns is the same as the number of the vertical signal lines VSL.

The load transistor unit LMU is arranged on the upper side of the pixel array 110 in the drawing, and the load transistor unit LMD is arranged on the lower side of the pixel array 110 in the drawing. The load transistor unit LMD is provided with a plurality of load transistors (not illustrated) corresponding to the vertical signal lines VSL. The load transistor functions as a current source of a source follower at the time of reading out a pixel signal. The load transistor can be configured using a MOS transistor. In addition, the load transistor is similarly formed in the load transistor unit LMU.

In addition, a wiring $L_{VDD}$, a wiring LV, a wiring L1, and a wiring L2 are arranged in each of the load transistor units LMU and LMD. These wirings $L_{VDD}$, LV, L1, and L2 extend along a longitudinal direction of the load transistor units LMU and LMD. In addition, a switching unit SW is provided in each of the load transistor units LMU and LMD. The switching unit SW is provided for each column C corresponding to the plurality of pixels 111 in the column direction.

The wiring $L_{VDD}$ arranged in the load transistor unit LMU and the wiring $L_{VDD}$ arranged in the load transistor unit LMD are connected by a wiring UD, and a power supply voltage is supplied from the wiring UD to each of the pixels 111. In detail, from the wiring $L_{VDD}$, a power supply voltage VDD is supplied to a storage node (SN) capacitor CPs, a floating diffusion (FD) capacitor CPf, and a drain of an amplification transistor Tamp illustrated in FIG. 3 below.

The wiring LV, the wiring L1, the wiring L2, and the switching unit SW will be described in detail later.

The comparator circuit unit CMU is arranged on the upper side of the load transistor unit LMU in the drawing. Further, the counter unit CNU is arranged on the upper side of the comparator circuit unit CMU in the drawing. The comparator circuit unit CMU and the counter unit CNU function as an analog-to-digital conversion unit. As a result, the analog charge signal output from the pixel 111 to the vertical signal line VSL through the pixel readout circuit 20 is converted into a digital signal, and a pixel signal as the digital signal is output to a circuit in a subsequent stage under the control of the horizontal scanning circuit. The same is also applied for the comparator circuit unit CMD and the counter unit CND.

<Circuit Configuration for Each Pixel>

Figure 3:
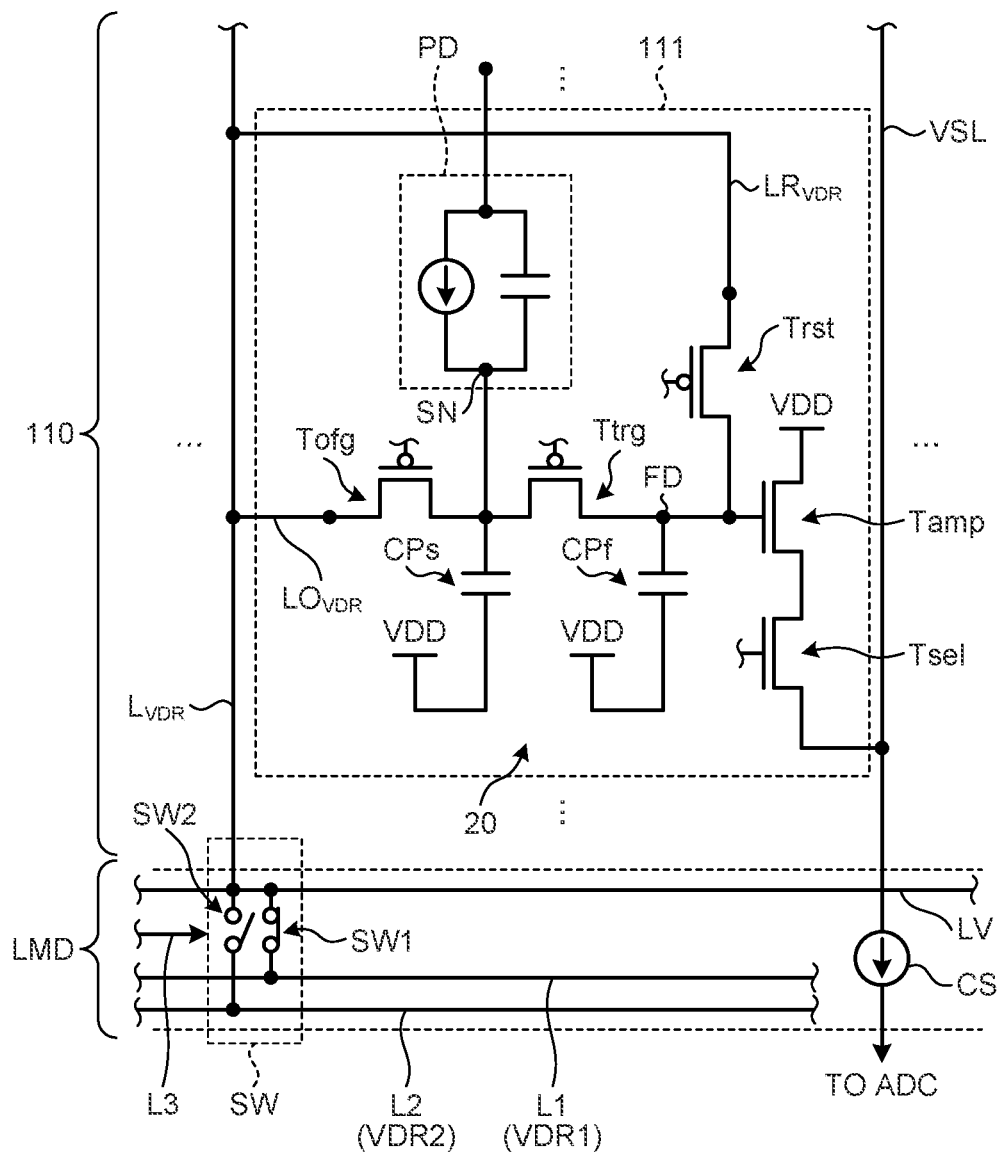
FIG. 3 is a schematic circuit diagram illustrating an example of a circuit configuration for each pixel in a semiconductor device included in the imaging element according to the first embodiment.

Next, an example of a circuit configuration for each pixel provided on the ROIC substrate 200 will be described with reference to FIG. 3. FIG. 3 illustrates one pixel 111 among the plurality of pixels 111 in the column direction connected to one vertical signal line VSL and the load transistor unit LMD. In addition, the above load MOS transistor provided in the load transistor unit LMD is illustrated as a current source CS in FIG. 3. Note that the load transistor unit LMU arranged on the upper side of the pixel array 110 is omitted in FIG. 3.

As illustrated in FIG. 3, the photodiode PD is electrically connected to the pixel readout circuit 20 through the storage node SN in the pixel 111. This electrical connection corresponds to the connection between the lower electrode 11A and the connection electrode 21A in FIG. 1. The SN capacitor CPs is formed for the storage node SN. The charge signal from the photodiode PD is accumulated in the SN capacitor CPs through the storage node SN. As a result, a charge amount of the charge signal is converted into a voltage value. In addition, the storage node SN is electrically connected with a source of an overflow gate (OFG) transistor Tofg and a drain of a transfer transistor Ttrg.

A floating diffusion layer FD is provided on a source side of the transfer transistor Ttrg, and the FD capacitor CPf is formed for the floating diffusion layer FD. The source of the transfer transistor Ttrg is connected to a source of a reset transistor Trst. When a bias voltage (a reset signal RST to be described later) is applied to a gate of the reset transistor Trst, the reset transistor Trst is turned on, and the FD capacitor CPf is reset (a charge stored in the FD capacitor CPf is discharged).

Note that the OFG transistor Tofg, the transfer transistor Ttrg, and the reset transistor Trst are P-channel MOS transistors (corresponding to the MOS transistor 23P in FIG. 1) in the present embodiment. That is, these MOS transistors are usually turned off, and turned on when a negative voltage is applied to their gates.

In addition, the floating diffusion layer FD is connected to a gate of the amplification transistor Tamp. The drain of the amplification transistor Tamp is connected to a predetermined power supply that is provided outside the imaging element 1 (FIGS. 1 and 2) and outputs a voltage of the voltage VDD, and a source of the amplification transistor Tamp is connected to a drain of a selection transistor Tsel. The amplification transistor Tamp and the selection transistor Tsel are N-channel MOS transistors (corresponding to the MOS transistor 23N in FIG. 1). That is, these MOS transistors are usually turned OFF, and turned on when a positive voltage is applied to their gates.

When the selection transistor Tsel is turned on in a case where a charge is stored in the FD capacitor CPf and a positive voltage is generated in the floating diffusion layer FD, a signal based on the charge signal generated by the photodiode PD is output to the load transistor unit LMD through the vertical signal line VSL.

The wiring LV is formed in the load transistor unit LMD. The wiring LV is connected to a pad (not illustrated) provided in an outer edge portion (an outer edge portion of an imaging element chip) of the imaging element 1 (FIG. 2), and the predetermined external power supply can be electrically connected to the pad. The power supply is provided to supply a reset voltage to the OFG transistor Tofg and the reset transistor Trst when imaging is performed using the imaging element 1 (during a normal operation). The reset voltage is about 1.2 V, for example.

A wiring $L_{VDR}$ is electrically connected to the wiring LV. The wiring $L_{VDR}$ extends in the column direction (direction parallel to the vertical signal line VSL) and supplies the reset voltage to the OFG transistor Tofg and the reset transistor Trst of each of the pixels 111 of the plurality of pixels 111 arrayed in the column direction. Specifically, each of the pixels 111 is provided with a wiring $LO_{VDR}$ that electrically connects the wiring $L_{VDR}$ and the OFG transistor Tofg, and a wiring $LO_{VDR}$ that electrically connects the wiring $L_{VDR}$ and the reset transistor Trst.

In addition, the wiring LV is provided with the switching unit SW. The switching unit SW has a first switch SW1 and a second switch SW2. The first switch SW1 and the second switch SW2 are selectively turned on and off. That is, the second switch SW2 is turned off when the first switch SW1 is turned on, and the second switch SW2 is turned on when the first switch SW1 is turned off. The switches SW1 and SW2 of the switching unit SW can be configured using one or a plurality of MOS transistors. In this case, the MOS transistor may be either an N-channel MOS transistor or a P-channel transistor. In addition, the switching unit SW can also be configured using a complementary metal oxide semiconductor (CMOS) transistor.

In detail, the first switch SW1 is connected to the wiring $L_{VDR}$ at one end and connected to the wiring L1 at the other end. The wiring L1 is electrically connected to a test pad (not illustrated) for the wiring L1 provided in the outer edge portion (outer edge portion of the imaging element chip) of the imaging element 1 (FIGS. 1 and 2). If the predetermined external power supply that outputs a voltage VDR1 to the test pad is electrically connected, when the first switch SW1 is turned on, the voltage VDR1 can be applied to a drain of the OFG transistor Tofg through the wiring L1, the wiring $L_{VDR}$, and the wiring $LO_{VDR}$, and the voltage VDR1 can be applied to a drain of the reset transistor Trst through the wiring L1, the wiring $L_{VDR}$, and a wiring $LR_{VDR}$. Note that the voltage VDR1 may be any voltage as long as being lower than withstand voltages of the reset transistor Trst and the OFG transistor Tofg.

On the other hand, the second switch SW2 is connected to the wiring $L_{VDR}$ at one end and connected to the wiring L2 at the other end. The wiring L2 is connected to a test pad (not illustrated) for the wiring L2 provided in the outer edge portion of the imaging element 1 (FIGS. 1 and 2). If the predetermined external power supply that outputs a voltage VDR2 to the test pad is electrically connected, when the second switch SW2 is turned on, the voltage VDR2 can be applied to a drain of the OFG transistor Tofg through the wiring L1, the wiring $L_{VDR}$, and the wiring $LO_{VDR}$, and the voltage VDR2 can be applied to a drain of the reset transistor Trst through the wiring L1, the wiring $L_{VDR}$, and a wiring $LR_{VDR}$. The voltage VDR2 may be 1.2 V or about 1.2 V, for example. That is, the voltage VDR2 can be made identical to the reset voltage supplied from the wiring LV.

As described above, the switching unit SW forms a voltage switching unit that supplies the voltages having different voltage values to the OFG transistor Tofg and the reset transistor Trst, respectively. In addition, the wiring LV, the wiring L1, and the wiring L2 extend in the horizontal direction through the load transistor unit LMD, and the switching unit SW is provided for the plurality of pixels 111 arrayed in the column direction.

Note that a wiring L3 illustrated in FIG. 3 is a wiring that supplies a drive signal for driving the switching unit SW. The switching unit SW can be operated by supplying the drive signal from the outside of the imaging element 1 to the wiring L3. In addition, the wiring L3 is also formed in the load transistor unit LMD similarly to the wiring LV, the wiring L1, and the wiring L2. Note that, in a case where the switch SW1 of the switching unit SW is configured using a P-channel MOS transistor, and the switch SW2 is configured using an N-channel MOS transistor, for example, the switch SW1 and the switch SW2 can be selectively turned on and off using the wiring L3 by connecting one of a source and a drain of the P-channel MOS transistor (SW1) to the wiring LV, connecting the other to the wiring L1, connecting one of a source and a drain of the N-channel MOS transistor (SW2) to the wiring LV, connecting the other to the wiring L2, and connecting gates of both the MOS transistors to the wiring L3. In addition, in a case where the switches SW1 and SW2 are configured using P-channel MOS transistors (or N-channel MOS transistors), the switch SW1 and the switch SW2 can be selectively turned on and off by providing an additional wiring L3 and connecting one wiring L3 to a gate of one P-channel MOS transistor (or N-channel MOS transistor), connecting the other wiring L3 to a gate of the other P-channel MOS transistor (or N-channel MOS transistor), and alternately applying a gate voltage.

As illustrated in FIG. 2, a voltage to be supplied to a corresponding wiring in the load transistor unit LMD is supplied from the predetermined external power supply to the wiring LV, the wiring L1, the wiring L2, and the wiring L3 arranged in the load transistor unit LMU. In addition, the switching unit SW of the load transistor unit LMU and the switching unit SW of the load transistor unit LMD can be controlled synchronously. For example, when it is difficult to sufficiently ensure a line width or the like of the wiring $L_{VDR}$ provided on the ROIC substrate 200, there is a possibility that the resistance of the wiring $L_{VDR}$ increases, but a predetermined voltage can be easily supplied to all the pixels 111 of the pixel array 110 if the switching unit SW, the wiring LV, the wiring L1, the wiring L2, and the wiring L3 on both sides of the pixel array 110 are used.

[Operation of Pixel Readout Circuit of Imaging Element According to First Embodiment During Imaging]

Next, an operation of the pixel readout circuit 20 of the imaging element 1 during imaging (normal operation) will be described with reference to FIGS. 1 to 3.

During imaging, the predetermined external power supply that outputs the reset voltage (for example, 1.2 V) is connected to the wiring LV, but the corresponding power supply is not connected (no voltage is supplied) to the wiring L1 and the wiring L2.

First, the OFG transistor Tofg and the transfer transistor Ttrg are turned off under the control of the vertical scanning circuit. Next, when a negative voltage is applied to the gate so that the OFG transistor Tofg is turned on, the photodiode PD and the SN capacitor CPs are reset through the wiring $L_{VDR}$ and the wiring LV.

Next, the reset transistor Trst is turned on under the control of the vertical scanning circuit after a lapse of a predetermined time, and the FD capacitor CPf is reset. After a lapse of a predetermined time, the reset transistor Trst is turned off again, and the reset of the FD capacitor CPf is ended.

Then, the photodiode PD is exposed to light. As a result, a charge is generated in the photodiode PD, and the generated charge is accumulated in the SN capacitor CPs. During the light exposure of the photodiode PD, a positive voltage is applied to the gate of the selection transistor Tsel under the control of the vertical scanning circuit, so that the selection transistor Tsel is turned on. As a result, the charge of the reset FD capacitor CPf is read out to the vertical signal line VSL. That is, readout of a noise component of the pixel 111 (readout of a pre-charge phase (hereinafter referred to as P-phase readout)) is performed. After the P-phase readout is ended, the reset transistor Trst and the selection transistor Tsel are turned off.

When a negative voltage is applied to the gate of the transfer transistor Ttrg under the control of the vertical scanning circuit after the light exposure of the photodiode PD is completed, the transfer transistor Ttrg is turned on, and the charge accumulated in the SN capacitor CPs is transferred to the FD capacitor CPf. When the selection transistor Tsel is turned on again at a timing at which the transfer is predicted to end, a voltage of the floating diffusion layer PD is output to the vertical signal line VSL. The voltage of the floating diffusion layer PD at this time is based on the charge generated by the photodiode PD, that is, a charge signal based on a light amount of received light is read out to the vertical signal line VSL. That is, readout of a data phase (hereinafter referred to as D-phase readout) during imaging is performed. Such an operation is performed for all the pixels 111 under the control of the vertical scanning circuit and the vertical scanning circuit, and signals are read out from all the pixels 111 to form an image.

Here, when a difference between the signal read out by the D-phase readout and the signal read out by the P-phase readout is obtained, offset noise is removed, and substantially only a signal component is extracted. The signal component is subjected to analog-to-digital conversion by the comparator circuit unit CMU (CMD) and the counter unit CNU (CND) through the load transistor unit LMU (LMD). This digital signal is output to the outside of the imaging element 1 through a predetermined logic circuit.

[Operations During Evaluation of Pixel Readout Circuit of Imaging Element According to First Embodiment]

Figure 4:
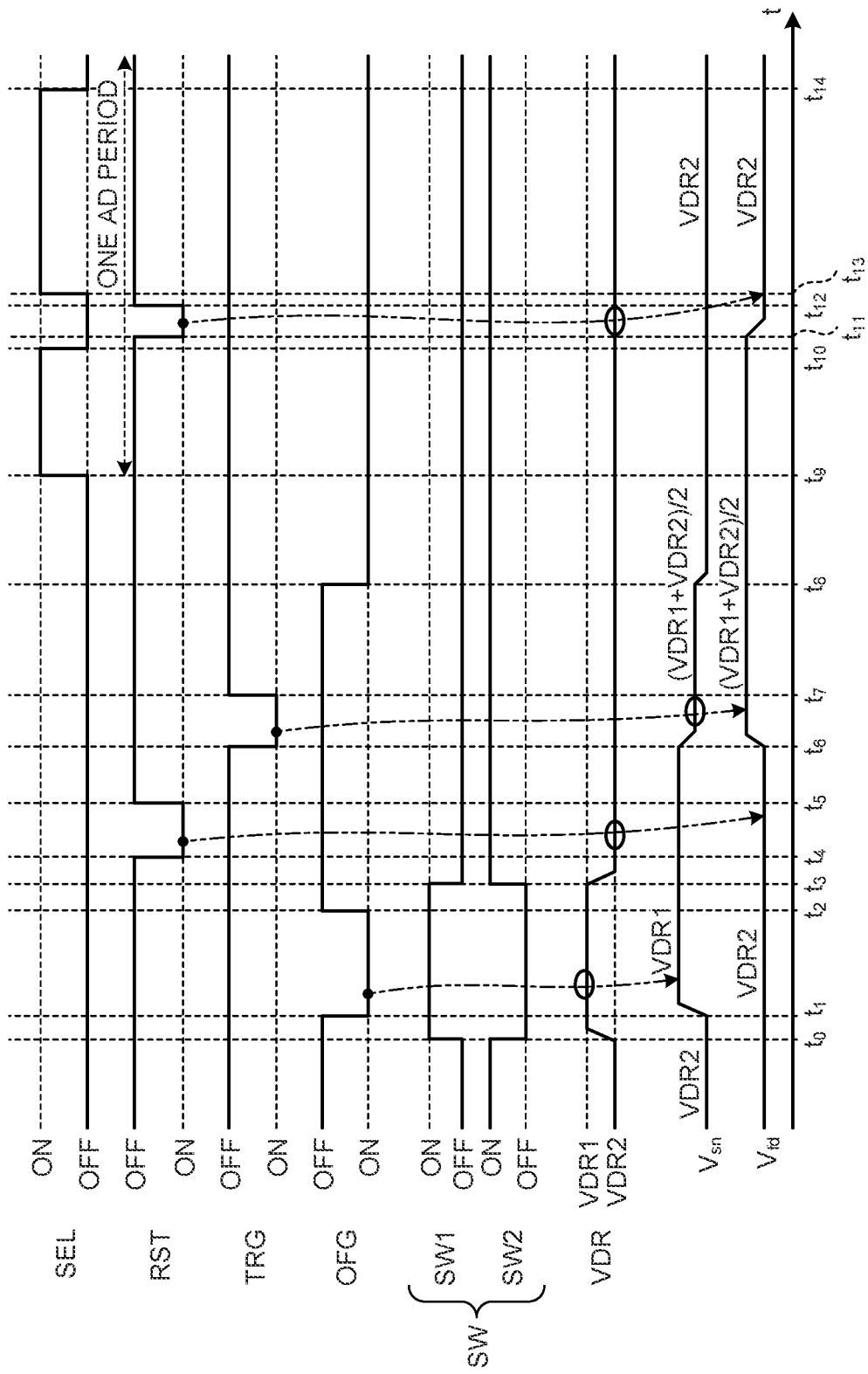
FIG. 4 is a time chart relating to a state of each of circuit elements and a signal supplied to each of the circuit elements for each pixel of the semiconductor device included in the imaging element according to the first embodiment.

Next, operations for evaluating the pixel readout circuit 20 will be described with reference to FIG. 4 in addition to FIG. 3. FIG. 4 is a time chart illustrating an ON/OFF timing of a signal supplied to each of circuit elements of the pixel readout circuit 20 and a state of each of the circuit elements.

Note that the operations to be described hereinafter are not operations during imaging (or in a normal state) of the imaging element 1 (FIGS. 1 and 2), but are operations during evaluation of the ROIC substrate 200 of the imaging element 1. In addition, a jumper terminal LVJ connected to the wiring LV illustrated in FIG. 1 is open during the operations. That is, no voltage is supplied from the external power supply to the wiring LV, and the wiring L1 or the wiring L2 is selectively connected to the wiring LV by the switching unit SW to supply different voltages to the wiring LV (and the wiring $L_{VDR}$), which is different from the time of imaging. In addition, the following operations can be implemented by using a predetermined evaluation device. That is, the following operations can be implemented by supplying various signals to be described below to the ROIC substrate 200 from the evaluation device.

Referring to FIG. 4, a selection signal SEL, the reset signal RST, a transfer signal TRG, and an overflow gate signal OFG are turned off under the control of the evaluation device in the initial state before time t0 (left side in the drawing). Here, the selection signal SEL is a signal supplied to the gate of the selection transistor Tsel, the reset signal RST is a signal supplied to the gate of the reset transistor Trst, the transfer signal TRG is a signal supplied to the gate of the transfer transistor Ttrg, and the overflow gate signal OFG is a signal supplied to the gate of the OFG transistor Tofg.

In addition, the first switch SW1 is set to OFF and the second switch SW2 is set to ON in the switching unit SW (FIG. 3) in the initial state. Thus, voltages of the drains of the reset transistor Trst and the OFG transistor Tofg are equal to the voltage VDR2 (for example, 1.2 V) of the wiring L2.

At time t0, the first switch SW1 and the second switch SW2 of the switching unit SW are switched by an instruction signal output from the evaluation device to the wiring L3 (FIG. 3). That is, the first switch SW1 is turned on, and the second switch SW2 is turned off. As a result, the voltage VDR1 of the wiring L1 is applied to the drains of the reset transistor Trst and the OFG transistor Tofg. In the present embodiment, the voltage VDR1 of the wiring L1 is set to any voltage lower than the withstand voltages of the reset transistor Trst and the OFG transistor Tofg and higher than the voltage VDR2 of the wiring L2. Thus, voltages VDR of the drains of the reset transistor Trst and the OFG transistor Tofg rise as compared with the voltages in the initial state.

When the overflow gate signal OFG is turned on, that is, a predetermined negative voltage is applied to the gate of the OFG transistor Tofg under the control of the evaluation device at time t1, the OFG transistor Tofg is turned on. As a result, a voltage of the storage node SN becomes the voltage VDR1, and a charge is accumulated in the SN capacitor CPs. The amount of the charge in the SN capacitor CPs at this time is denoted by Csn for convenience.

When the overflow gate signal OFG is turned off under the control of the evaluation device at time t2, the OFG transistor Tofg is turned off, and the storage node SN is electrically isolated. At this time, a voltage Vsn of the storage node SN is still the voltage VDR1 since the charge is accumulated in the SN capacitor CPs.

When the first switch SW1 is turned off and the second switch SW2 is turned on by the instruction signal output from the evaluation device to the wiring L3 at time t3, the voltages VDR of the drains of the reset transistor Trst and the OFG transistor Tofg become the voltage VDR2 (the voltage of the wiring L2) again.

When the reset signal RST is turned on under the control of the evaluation device and a predetermined negative voltage is applied to the gate of the reset transistor Trst at time t4, the reset transistor Trst is turned on. As a result, the floating diffusion layer FD (FD capacitor CPf) is reset. Thereafter, the reset signal RST is turned off at time t5. Note that the storage node SN is also electrically isolated between times t4 and t5, and the charge amount of the SN capacitor CPs is substantially unchanged. That is, the voltage Vsn of the storage node SN is still the voltage VDR1.

When the transfer signal TRG is turned on under the control of the evaluation device and a predetermined negative voltage is applied to the gate of the transfer transistor Ttrg at time t6, the transfer transistor Ttrg is turned on. As a result, conduction is obtained between the storage node SN and the floating diffusion layer FD, and a part of the charge accumulated in the SN capacitor CPs moves to the FD capacitor CPf. Here, the voltage Vsn of the storage node SN and a voltage Vfd of the floating diffusion layer FD are divided by a charge amount Csn of the SN capacitor CPs and a charge amount Cfd of the FD capacitor CPf. Since the charge amount Csn and the charge amount Cfd are equal to each other, the voltage Vfd of the floating diffusion layer FD and the voltage Vfd of the floating diffusion layer FD are equal to each other. Specifically, these voltages Vsn and Vfd are (voltage VDR1+voltage VDR2)/2. In the present embodiment, the voltages Vsn and Vfd at this time are higher than the voltage VDR2 as illustrated in the drawing since the voltage VDR1 is higher than the voltage VDR2.

The transfer signal TRG is turned off at time t7 when a sufficient time has elapsed for the part of the charge accumulated in the SN capacitor CPs to move to the FD capacitor CPf.

Subsequently, when the overflow gate signal OFG is turned on under the control of the evaluation device at time t8, the OFG transistor Tofg is turned on. At this time, the second switch SW2 is turned on, and thus, the voltage Vsn of the storage node SN becomes almost equal to the voltage VDR2 of the wiring L2. That is, the state of the storage node SN returns to the initial state. On the other hand, the voltage Vfd of the floating diffusion layer FD is still (voltage VDR1+voltage VDR2)/2 since the transfer transistor Ttrg is turned off.

Then, when the selection signal SEL is turned on under the control of the evaluation device so that the selection transistor Tsel is turned on at time t9, the voltage Vfd of the floating diffusion layer FD is read out to the vertical signal line VSL. The voltage Vfd of the floating diffusion layer FD at this time is higher than 1.2 V (the voltage VDR2) as described above. Such a voltage is obtained as the charge accumulated in the SN capacitor CPs is transferred to the FD capacitor CPf by the charge signal from the photodiode FD when imaging using the imaging element 1 is performed. That is, it can be said that this readout of the voltage Vfd of the floating diffusion layer FD corresponds to the readout of the data phase (hereinafter referred to as D-phase readout) during imaging.

Next, the selection signal SEL is turned off at time t10, and subsequently, the reset signal RST is turned on at time t11. As a result, the reset transistor Trst is turned on, and the FD capacitor CPf is reset. That is, the voltage Vfd of the floating diffusion layer FD becomes the voltage VDR2.

Thereafter, when the selection signal SEL is turned on again under the control of the evaluation device so that the selection transistor Tsel is turned on at time t13, the voltage Vfd of the floating diffusion layer FD is read out to the vertical signal line VSL. The voltage Vfd of the floating diffusion layer FD at this time is the voltage VDR2. That is, it can be said that this readout corresponds to the readout of noise, that is, the P-phase readout.

Note that a period between times t9 and t14 corresponds to a one AD period. The AD period is a period required until the charge signal based on the charge generated in the photodiode PD of the photoelectric conversion unit 100 is read out through the pixel readout circuit 20, passes through the load transistor unit LMU (LMD), and then, is subjected to the analog-to-digital conversion by the comparator circuit unit CMU (CMD) and the counter unit CNU (CND).

Finally, at time t14, the selection signal SEL is turned off under the control of the evaluation device, and a series of evaluation operations are ended. The series of evaluation operations are performed for all the pixels 111 under the control of the horizontal scanning circuit and the vertical scanning circuit, and the evaluation of the pixel readout circuits 20 of all the pixels 111 of the ROIC substrate 200 is ended.

As described above, the different voltages can be applied from the wirings L1 and L2 to the drain of the OFG transistor Tofg and the drain of the reset transistor Trst by operating the switching unit SW provided in the load transistor unit LMD (LMU) of the ROIC substrate 200 with the imaging element 1 according to the present embodiment. That is, the voltage Vfd of the floating diffusion layer FD can have a voltage value that may correspond to a voltage value during the D-phase readout even if no charge signal is output from the photodiode PD of each of the pixels 111. In other words, a situation where the voltages Vfd corresponding to the D-phase readout and the P-phase readout are different can be created. Accordingly, the pixel readout circuit 20 can be evaluated in both the D-phase readout and the P-phase readout without using the charge signal from the photodiode PD. Thus, even when the photoelectric conversion unit 100 and the ROIC substrate 200 are joined, it is possible to evaluate whether the ROIC substrate 200 normally operates without depending on the operation of the pixels 111 of the photoelectric conversion unit 100.

In addition, it is unnecessary to irradiate the photoelectric conversion unit 100 with light, the ROIC substrate 200 can be evaluated even before joining the photoelectric conversion unit 100 and the ROIC substrate 200. Therefore, it is possible to facilitate evaluation as the imaging element after joining if the photoelectric conversion unit 100 is joined to the ROIC substrate 200 which has been confirmed to operate normally by evaluating the ROIC substrate 200 before joining the photoelectric conversion unit 100 and the ROIC substrate 200. In addition, it is possible to manufacture the imaging element having a higher reliability. Further, the imaging element can be manufactured using the ROIC substrate 200 that has been confirmed to operate normally by performing the above evaluation, and thus, it is also possible to reduce the cost and price by improving the manufacturing yield of the imaging element.

In addition, the photoelectric conversion unit 100 of the imaging element 1 described above has the InGaAs film as the photoelectric conversion film 13, but the present invention is not limited thereto, and various types of the photoelectric conversion units 100 having wavelength sensitivity depending on types of the group III-V compound semiconductors and compositions of the group III-V compound semiconductor mixed crystals can be prepared. When the above photoelectric conversion unit 100 and the ROIC substrate 200 are joined, various imaging elements can be manufactured. In other words, the above ROIC substrate 200 can exist as a single semiconductor device.

Further, the linearity of output characteristics of the ROIC substrate 200 can be also evaluated by repeatedly performing the evaluation operations described with reference to the above time chart (FIG. 4) while changing the voltage VDR1. Such an evaluation can be also performed by measuring an output of the ROIC substrate 200 while changing the intensity of light with which the photoelectric conversion unit 100 is irradiated in a case where the photoelectric conversion unit 100 and the ROIC substrate 200 are joined. With the above operations, however, the linearity can be evaluated more easily as compared with the case of controlling the intensity of light with which the photoelectric conversion unit 100 is irradiated.

Note that the second switch SW2 of the switching unit SW may be turned on during imaging of the imaging element 1. Accordingly, a voltage of the voltage VDR2 (1.2 V) can be supplied to the wiring L2 from the predetermined external power supply, and the reset voltage (1.2 V) can be supplied from both the wiring LV and the wiring L2 to the OFG transistor Tofg and the reset transistor Trst. Therefore, the reset voltage can be stably supplied to each of the pixels 111 in the pixel array 110.

Modification (1) of First Embodiment

Next, a first modification of the imaging element 1 according to the first embodiment will be described with reference to FIG. 5. The first modification is different from the first embodiment in that a switching unit SWA is used instead of the switching unit SW in the load transistor units LMU and LMD, and the wiring L2 is not provided. The first modification and the first embodiment are substantially the same in terms of other configurations including the overall circuit layout except for such differences and changes caused by the differences. Hereinafter, differences from the ROIC substrate 200 in the first embodiment will be mainly described. Note that the load transistor unit LMU arranged on the upper side of the pixel array 110 is omitted even in FIG. 5.

Figure 5:
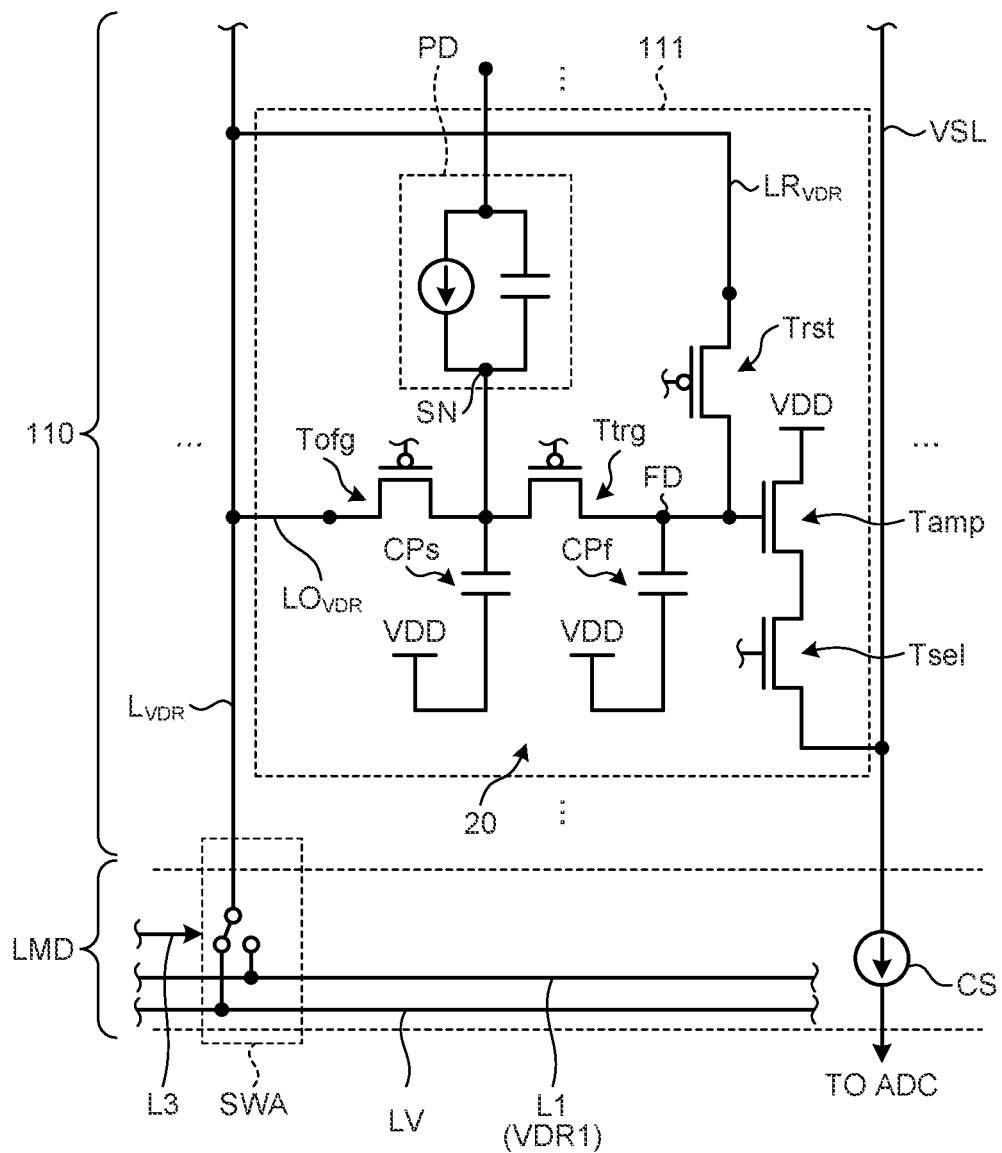
FIG. 5 is a schematic circuit diagram illustrating a first modification of the imaging element according to the first embodiment.

In the first modification, the wiring LV and the wiring L1 are provided in the load transistor unit LMD, and the wiring L2 in the first embodiment (see FIG. 3) is not provided as illustrated in FIG. 5. In addition, the load transistor unit LMD is provided with the switching unit SWA instead of the switching unit SW in the first embodiment. The switching unit SWA has one contact at one end and two contacts at the other end. The one contact at the one end is connected to the wiring $L_{VDR}$, one of the two contacts at the other end is connected to the wiring L1, and the other is connected to the wiring LV. The switching unit SWA operates such that the wiring LV and the wiring L1 are selectively connected to the wiring $L_{VDR}$. The switching unit SWA configured in this manner can also be formed using one or a plurality of MOS transistors. For example, it is possible to connect one of a source and a drain of an N-channel MOS transistor to the wiring L1, connect the other to the wiring $L_{VDR}$, connect one of a source and a drain of a P-channel MOS transistor to the wiring LV, connect the other to the wiring $L_{VDR}$, and connect gates of both the MOS transistors to the wiring L3. As a result, the switching unit SWA can be operated such that the wiring LV and the wiring L1 are selectively connected to the wiring $L_{VDR}$ by utilizing the wiring L3. In addition, the switching unit SWA may be formed using a CMOS transistor.

The wiring L1 is electrically connected to a predetermined external power supply that outputs the voltage VDR1 via a predetermined test pad as described above. When the switching unit SWA is switched to the wiring L1 side, the voltage VDR1 is applied to a drain of the OFG transistor Tofg through the wiring $L_{VDR}$ and the wiring $LO_{VDR}$, and the voltage VDR1 is applied to a drain of the reset transistor Trst through the wiring $L_{VDR}$ and the wiring $LR_{VDR}$.

The wiring LV is electrically connected to a predetermined external power supply which outputs a reset voltage through a predetermined pad as described above. When the switching unit SWA is switched to the wiring LV side, the reset voltage is applied to the drain of the OFG transistor Tofg through the wiring $L_{VDR}$ and the wiring $LO_{VDR}$, and the reset voltage is applied to the drain of the reset transistor Trst through the wiring $L_{VDR}$ and the wiring $LR_{VDR}$.

Here, the reset voltage is about 1.2 V, for example, and thus, is substantially equal to the voltage supplied to the drain of the OFG transistor Tofg and the drain of the reset transistor Trst from the wiring L2 in the first embodiment. In other words, it can be said that the substantially equal voltage is supplied from the wiring LV instead of supplying the voltage VDR2 (for example, 1.2 V) from the wiring L2. Accordingly, the evaluation operations described with reference to the time chart in FIG. 4 can also be executed in the ROIC substrate according to this modification. That is, even with this modification, the ROIC substrate can be evaluated regardless of whether the photoelectric conversion unit 100 is irradiated with light or not and whether the photoelectric conversion unit 100 is provided or not.

In addition, the number of wirings formed in the ROIC substrate can be reduced in the first modification since the wiring LV can be used instead of the wiring L2 of the ROIC substrate 200 according to the first embodiment.

Note that, in a case where imaging is performed in an imaging element to which the ROIC substrate according to the first modification is applied (in the normal operation), the switching unit SWA is switched to the wiring LV side, and the reset voltage is supplied to the OFG transistor Tofg and the reset transistor Trst through the wiring LV and the switching unit SWA.

Modification (2) of First Embodiment

Figure 6:
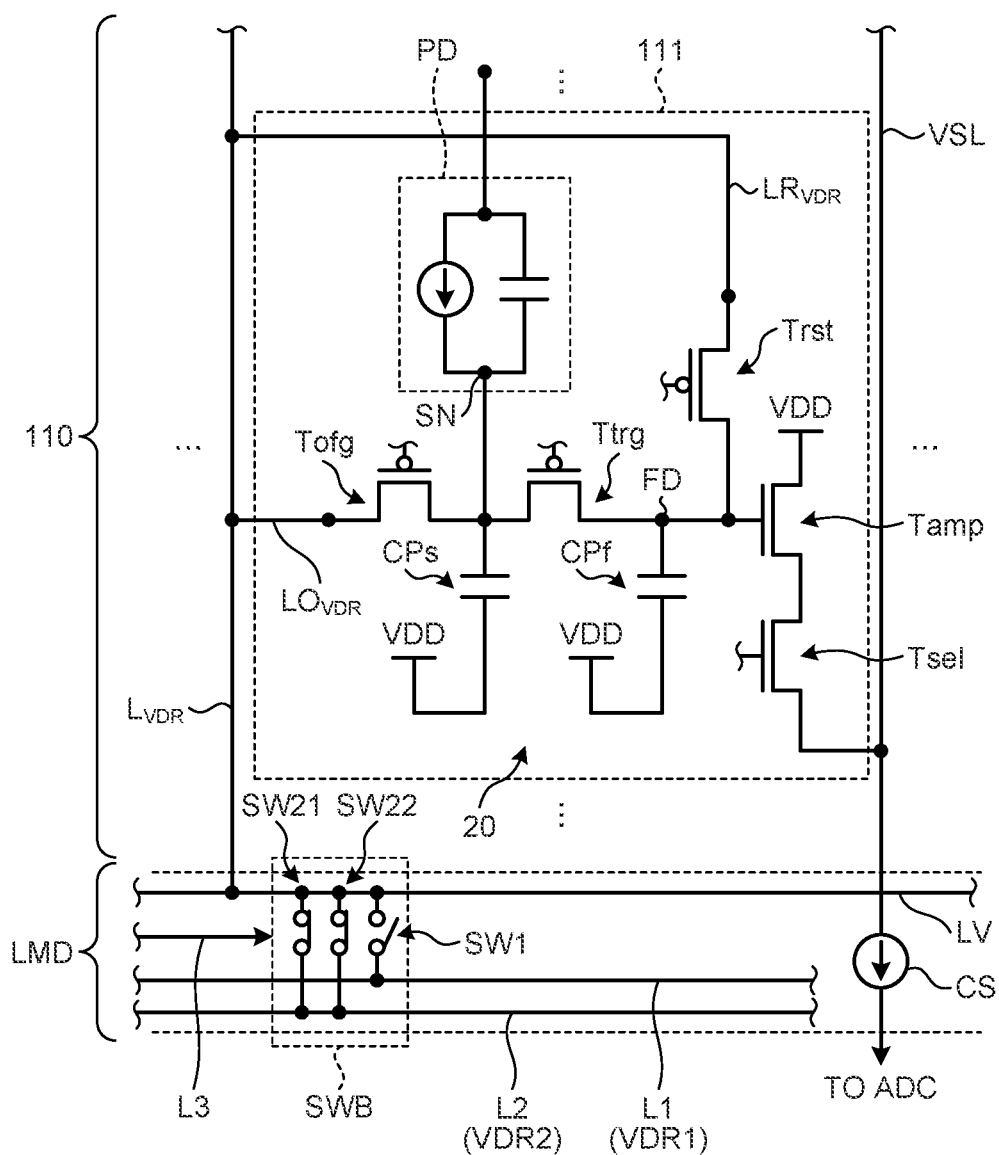
FIG. 6 is a schematic circuit diagram illustrating a second modification of the imaging element according to the first embodiment.

Subsequently, a second modification of the imaging element 1 according to the first embodiment will be described with reference to FIG. 6. In the second modification, an ROIC substrate having a different configuration from the ROIC substrate 200 of the imaging element 1 is used. The ROIC substrate in the second modification is different in that a switching unit SWB is used instead of the switching unit SW (FIG. 3) as compared with the ROIC substrate 200 according to the first embodiment. The second modification and the first embodiment are substantially the same in terms of the other configurations including the overall circuit layout except for such a difference and changes caused by the difference. Note that the load transistor unit LMU arranged on the upper side of the pixel array 110 is omitted even in FIG. 6.

The switching unit SWB includes the first switch SW1 provided between the wiring LV and the wiring L1, and second switches SW21 and SW22 provided between the wiring LV and the wiring L2. The second switches SW21 and SW22 are simultaneously turned on or off, and are turned on or off selectively with respect to the first switch SW1. That is, the first switch SW1 is turned off when the second switches SW21 and SW22 are turned on, and the first switch SW1 is turned on when the second switches SW21 and SW22 are turned off. The above switching unit SWB can be configured using a MOS transistor or the like, which is similar to the switching unit SW in the first embodiment described above.

With the above configuration, the evaluation operations described with reference to the time chart illustrated in FIG. 4 can be performed on the pixel readout circuit 20. That is, the second switches SW21 and SW22 of the present modification may be operated similarly to the second switch SW2 in FIG. 4. As a result, the same effects as those of the ROIC substrate 200 in the first embodiment are exhibited even in the ROIC substrate according to the second modification.

In addition, a reset voltage (1.2 V) can be supplied from the wiring LV and the wiring L2 to the OFG transistor Tofg and the reset transistor Trst by turning on the second switches SW21 and SW22 of the switching unit SWB and supplying a voltage of the voltage VDR2 (1.2 V) from a predetermined external power supply to the wiring L2. As a result, the reset voltage can be stably supplied to each of the pixels 111 in the pixel array 110. In addition, only one of the second switches SW21 and SW22 may be turned on in this case.

Second Embodiment

Figure 7:
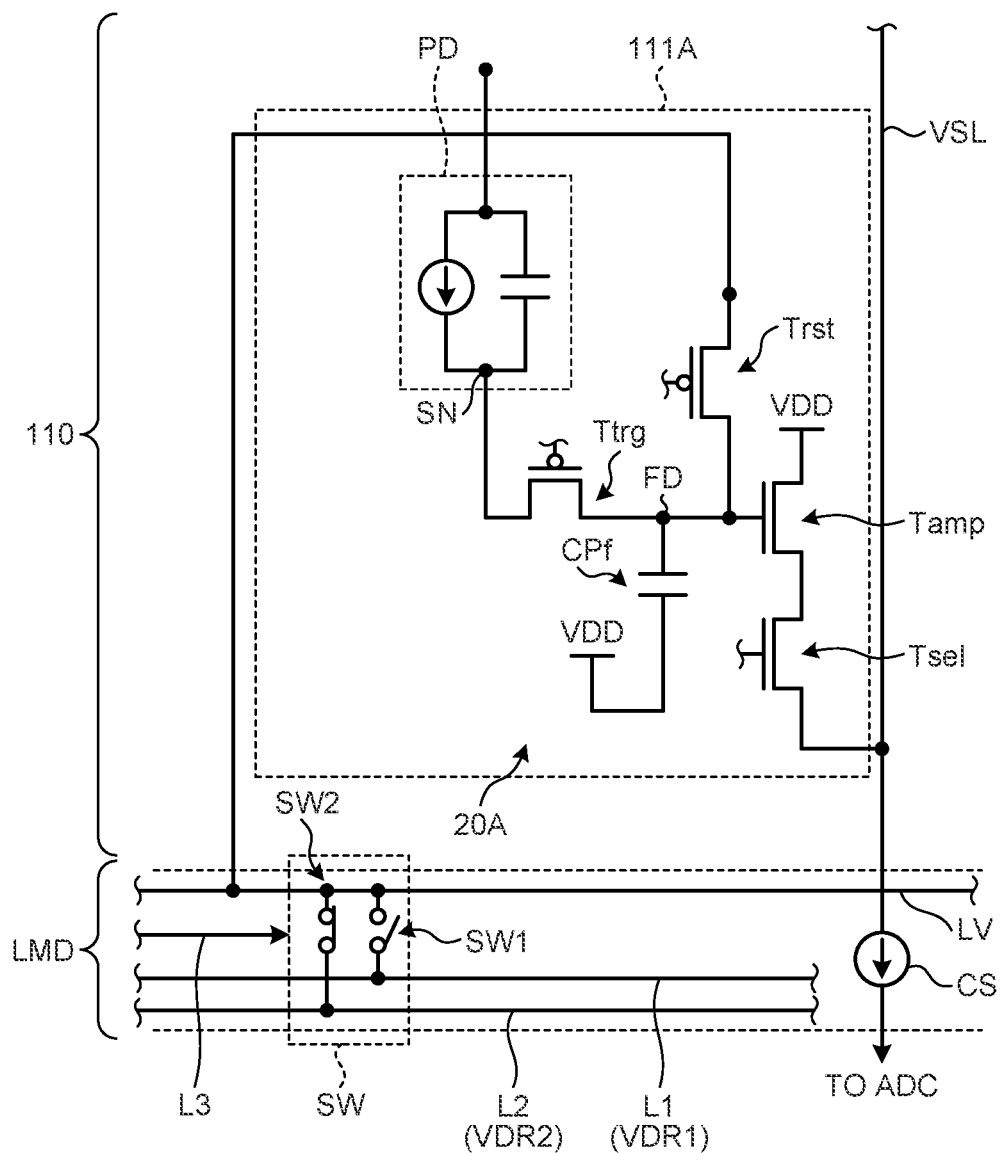
FIG. 7 is a schematic circuit diagram illustrating an example of a circuit configuration for each pixel of a semiconductor device included in an imaging element according to a second embodiment.

Next, an imaging element according to a second embodiment of the present disclosure will be described with reference to FIG. 7. In the second embodiment, a pixel 111A different from the pixel 111 (FIG. 3) of the ROIC substrate 200 in the first embodiment is provided, and the pixel 111A is provided with a pixel readout circuit 20A as illustrated in FIG. 7. The second embodiment and the first embodiment are substantially the same in terms of the other configurations, except for such differences and changes based the differences. Note that the load transistor unit LMU arranged on the upper side of the pixel array 110 is omitted even in FIG. 7.

The pixel readout circuit 20A is different from the pixel readout circuit 20 (FIG. 3) in the first embodiment in that the SN capacitor CPs and the OFG transistor Tofg are not provided. In the pixel readout circuit 20A, a charge signal from the photodiode PD is accumulated in the FD capacitor CPf through the transfer transistor Ttrg. Even with such a configuration, the voltage Vfd of the floating diffusion layer is output to the vertical signal line VSL when the selection transistor Tsel is turned on. In addition, the FD capacitor CPf is reset when the reset transistor Trst is turned on. That is, the D-phase readout and the P-phase readout are performed.

Figure 8:
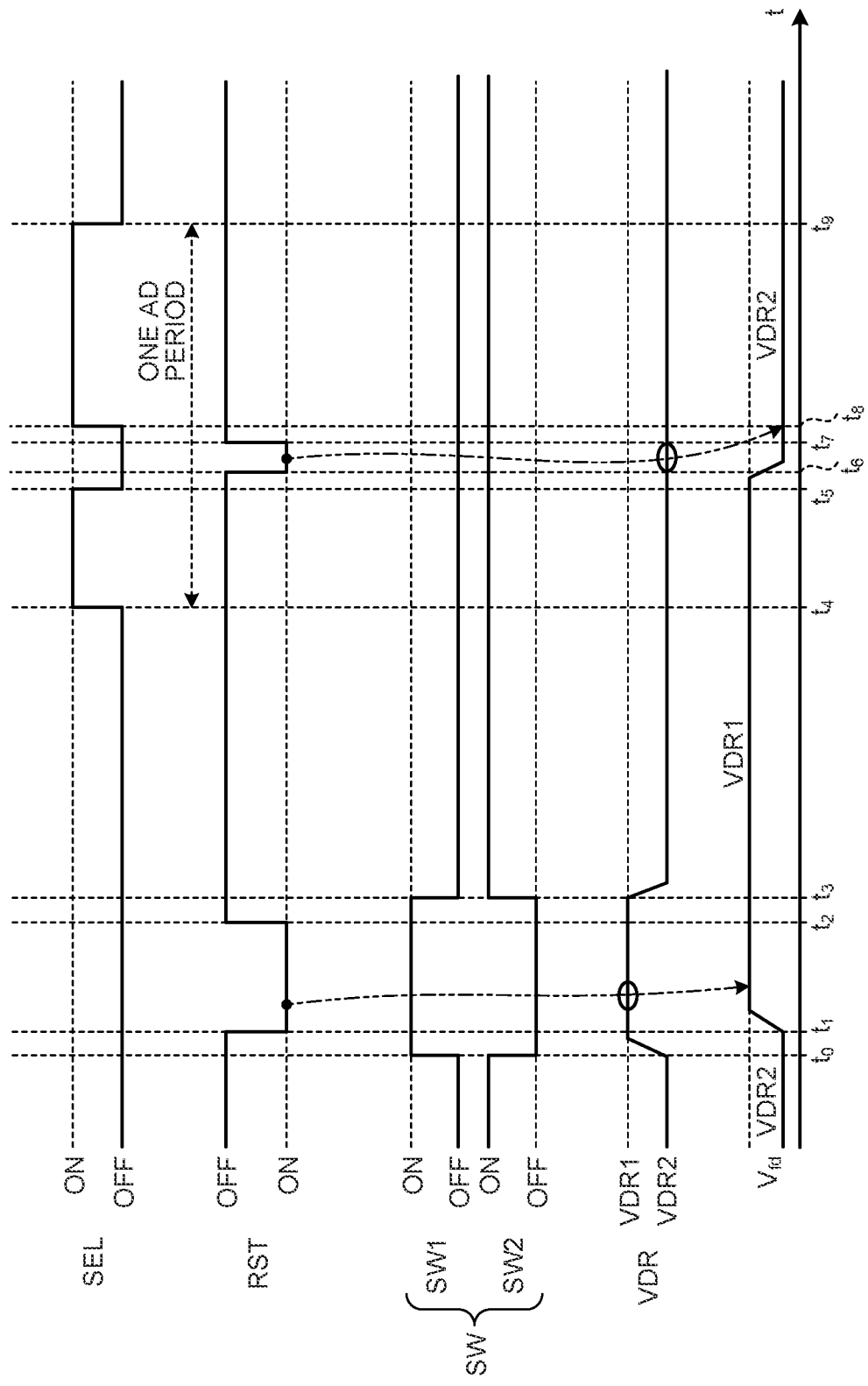
FIG. 8 is a time chart relating to a state of each of circuit elements and a signal supplied to each of the circuit elements for each pixel of the semiconductor device included in the imaging element according to the second embodiment.

Next, evaluation operations of the pixel readout circuit 20A will be described with reference to FIG. 8. FIG. 8 is a time chart illustrating exemplary evaluation operations of the pixel readout circuit 20A.

Referring to FIG. 8, the selection signal SEL and the reset signal RST are turned off in the initial state before time t0 (left side in the drawing). In addition, in the initial state, the first switch SW1 of the switching unit SW (FIG. 7) is turned off, and the second switch SW2 is turned on. Thus, the voltage VDR of a drain of the reset transistor Trst becomes the voltage VDR2 (for example, 1.2 V) of the wiring L2.

Next, at time t0, the first switch SW1 and the second switch SW2 of the switching unit SW are switched. That is, the first switch SW1 is turned on, and the second switch SW2 is turned off. As a result, the voltage VDR1 of the wiring L1 is applied to the drain of the reset transistor Trst. In the present embodiment, the voltage VDR1 of the wiring L1 is set to any voltage lower than a withstand voltage of the reset transistor Trst and higher than the voltage VDR2 of the wiring L2. Thus, the voltage VDR of the drain of the reset transistor Trst rises as compared with the voltage before time t0.

When the reset signal RST is turned on, that is, a predetermined negative voltage is applied to a gate of the reset transistor Trst at time t1, the reset transistor Trst is turned on. As a result, conduction is obtained between the wiring L1 and the floating diffusion layer FD, the voltage of the floating diffusion layer FD becomes equal to the voltage VDR1 of the wiring L1, and a charge is accumulated in the FD capacitor CPf.

The reset signal RST is turned off at time t2, and subsequently, the first switch SW1 and the second switch SW2 of the switching unit SW are switched at time t3. That is, the first switch SW1 is turned off, and the second switch SW2 is turned on. As a result, the voltage VDR of the drain of the reset transistor Trst becomes equal to the voltage VDR2 of the wiring L2 again. However, the FD capacitor CPf is electrically isolated since the transfer transistor Ttrg and the reset transistor Trst are turned off. Therefore, the voltage Vfd of the floating diffusion layer FD is still the voltage VDR1.

Then, when the selection signal SEL is turned on so that the selection transistor Tsel is turned on at time t4, the voltage Vfd of the floating diffusion layer FD is read out to the vertical signal line VSL. When the selection signal SEL is turned off at time t5 and the reset signal RST is turned on at time t6, the FD capacitor CPf is reset, and the voltage Vfd of the floating diffusion layer FD becomes equal to the voltage VDR2 (for example, 1.2 V) of the wiring L2.

Thereafter, when the selection signal SEL is turned on again at time t8 so that the selection transistor Tsel is turned on, the voltage Vfd (for example, 1.2 V) of the floating diffusion layer FD is read out to the vertical signal line VSL. Subsequently, the selection signal SEL is turned off at time t9.

As described above, the selection signal SEL is turned on twice, but the readout in the first ON state corresponds to the D-phase readout, and the readout in the second ON state corresponds to the P-phase readout. That is, a period from time t4 to time t9 is one AD period. The voltage Vfd of the floating diffusion layer FD during the D-phase readout is the voltage VDR1, and the voltage Vfd of the floating diffusion layer FD during the P-phase readout is the voltage VDR2. That is, the voltage Vfd of the floating diffusion layer FD has different voltage values between the D-phase readout and the P-phase readout, and thus, the pixel readout circuit 20A can be evaluated for both the D-phase readout and the P-phase readout without using a charge signal from the photodiode PD. That is, even with the imaging element according to the second embodiment, an ROIC substrate can be evaluated regardless of whether the photoelectric conversion unit 100 is irradiated with light or not and whether the photoelectric conversion unit 100 is provided or not.

Third Embodiment

Figure 9A:
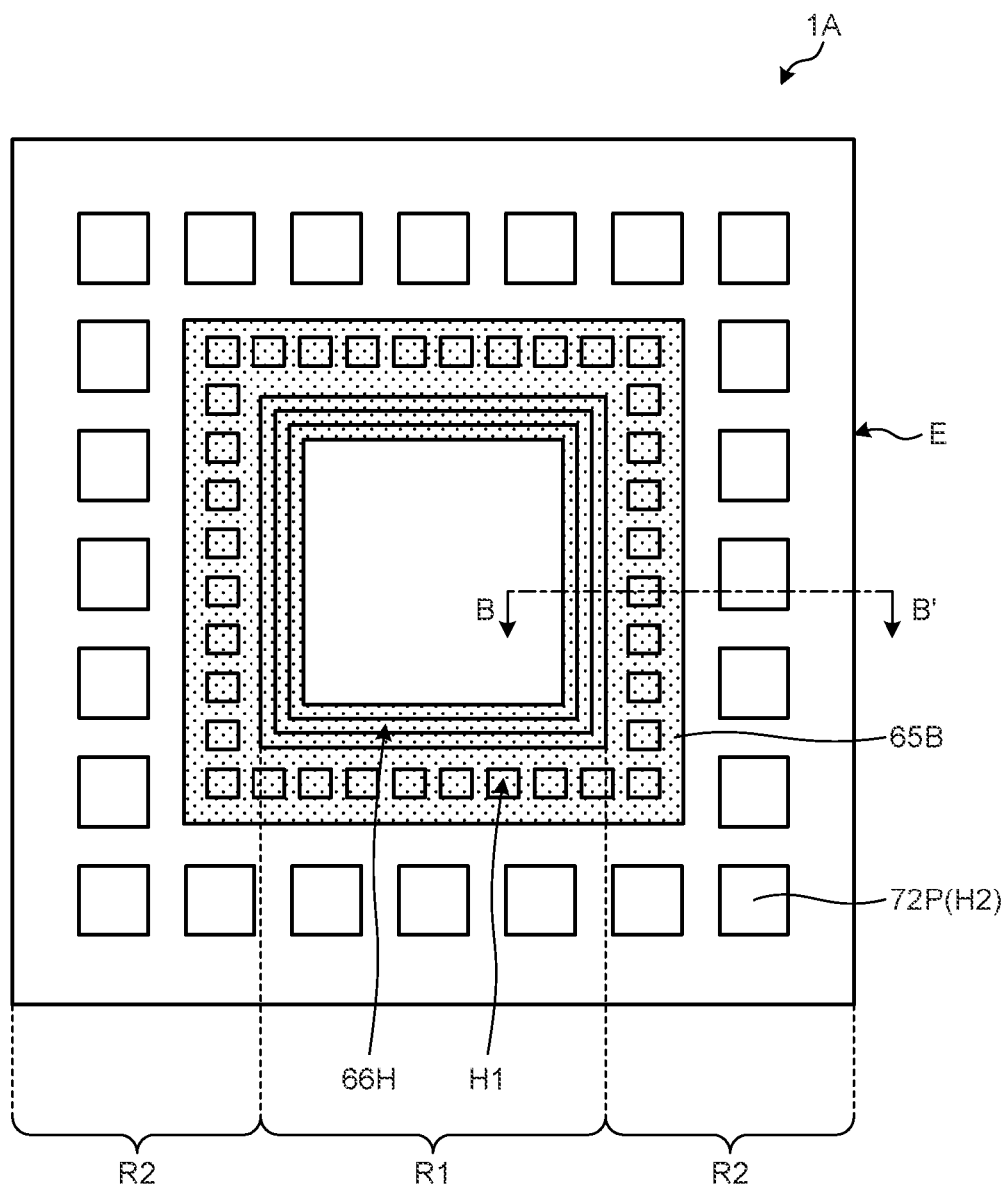
FIG. 9A is a partial plan view schematically illustrating an imaging element according to a third embodiment.
Figure 9B:
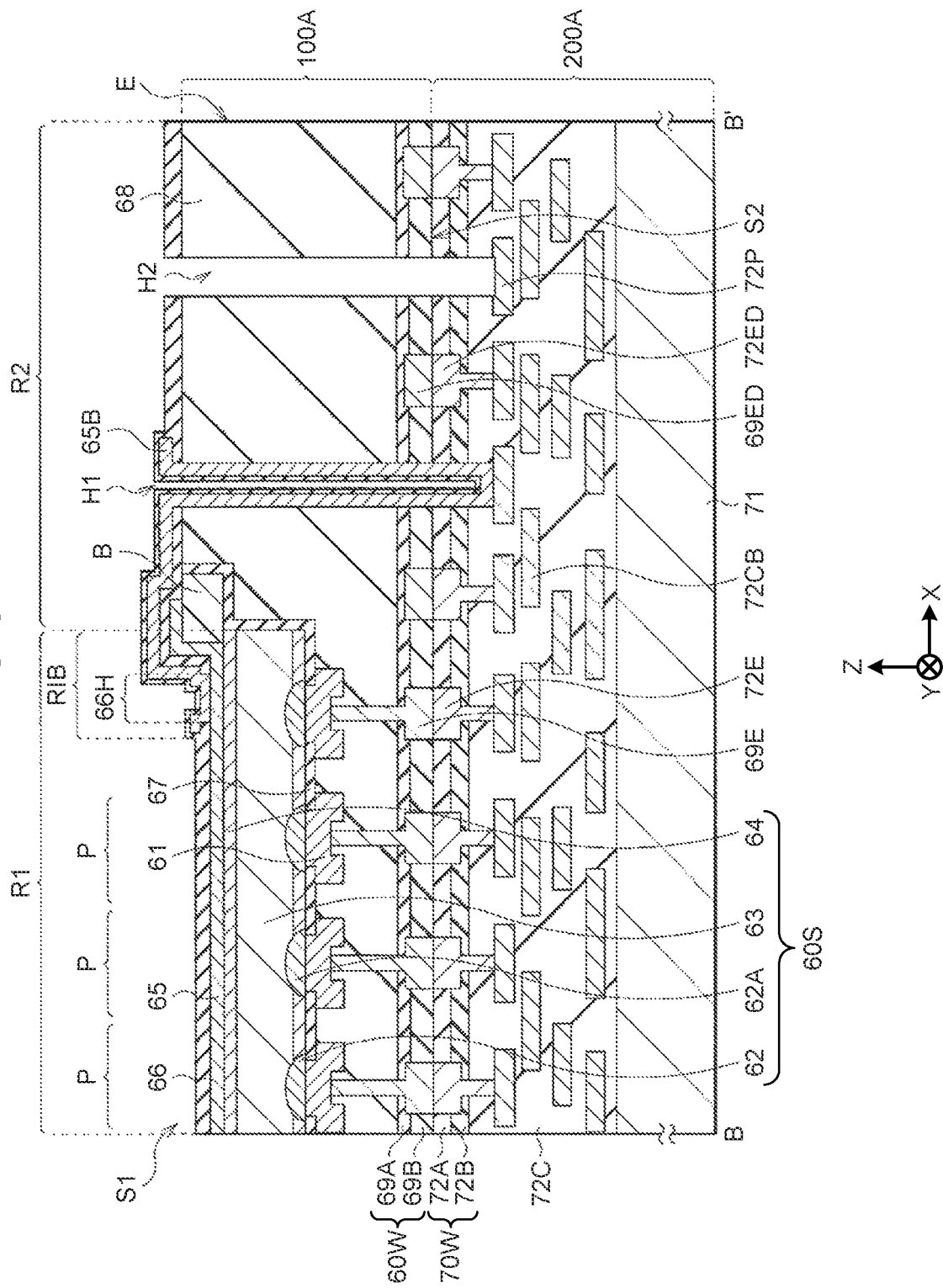
FIG. 9B is a partial cross-sectional view schematically illustrating the imaging element according to the third embodiment.

Next, an imaging element according to a third embodiment of the present disclosure will be described with reference to FIGS. 9A and 9B. FIGS. 9A and 9B are views schematically illustrating a configuration of an imaging element 1A according to the third embodiment. FIG. 9A represents a planar configuration of the imaging element 1A, and FIG. 9B represents a cross-sectional configuration taken along line B-B' of FIG. 9A. The imaging element 1A is applied to, for example, an infrared sensor or the like using a compound semiconductor material such as a group III-V semiconductor, and responds to light having wavelengths, for example, from a visible region (for example, equal to or more than 380 and less than 780 nm) to a short infrared region (for example, equal to or more than 780 nm and less than 2400 nm). The imaging element 1A is provided with a plurality of light receiving unit regions P (pixels P) arranged in two dimensions, for example (FIG. 9B).

The imaging element 1A has an element region R1 as a central portion and a peripheral region R2 that is provided outside the element region R1 and surrounds the element region R1 (FIG. 9A). The imaging element 1A has a conductive film 65B extending from the element region R1 to a part of the peripheral region R2. The conductive film 65B has an opening in a region facing a central portion of the element region R1.

The imaging element 1A has a stacked structure of a photoelectric conversion unit 100A and an ROIC substrate 200A (FIG. 9B). One surface of the photoelectric conversion unit 100A is a light incident surface (light incident surface S1), and a surface (the other surface) opposite to the light incident surface S1 is a junction surface (junction surface S2) with the ROIC substrate 200A.

The photoelectric conversion unit 100A includes a wiring layer 60W, first electrodes 61, a semiconductor layer 60S (first semiconductor layer), a second electrode 65, and a passivation film 66 in this order from a position closer to the ROIC substrate 200A. The semiconductor layer 60S has a surface facing the wiring layer 60W and an end surface (side surface) which are covered with an insulating film 67. The ROIC substrate 200A includes a wiring layer 70W and a multilayer wiring layer 72C, which are in contact with the junction surface S2 of the photoelectric conversion unit 100A, and a semiconductor substrate 71 facing the photoelectric conversion unit 100A with the wiring layer 70W and the multilayer wiring layer 72C interposed therebetween.

The photoelectric conversion unit 100A has the semiconductor layer 60S in the element region R1. In other words, a region where the semiconductor layer 60S is provided is the element region R1 of the imaging element 1A. In the element region R1, a region exposed from the conductive film 65B (a region facing the opening of the conductive film 65B) is a light receiving region. In the element region R1, a region covered with the conductive film 65B is an optical black (OPB) region R1B. The OPB region R1B is provided to surround the light receiving region. The OPB region R1B is used to obtain a black-level pixel signal. The photoelectric conversion unit 100A has the insulating film 67 and a buried layer 68 in the peripheral region R2. The peripheral region R2 is provided with holes H1 and H2 penetrating through the photoelectric conversion unit 100A and reaching the ROIC substrate 200A. In the imaging element 1A, light is incident on the semiconductor layer 60S from the light incident surface S1 of the photoelectric conversion unit 100A through the passivation film 66, the second electrode 65, and a second contact layer 64. A signal charge photoelectrically converted by the semiconductor layer 60S moves through the first electrode 61 and the wiring layer 60W and is read out to the ROIC substrate 200A. Hereinafter, a configuration of each portion will be described.

The wiring layer 60W is provided in the element region R1 and the peripheral region R2, and has the junction surface S2 with the ROIC substrate 200A. In the imaging element 1A, the junction surface S2 of the photoelectric conversion unit 100A is provided in the element region R1 and the peripheral region R2. For example, the junction surface S2 of the element region R1 and the junction surface S2 of the peripheral region R2 constitute the same plane. In the imaging element 1A, the junction surface S2 of the peripheral region R2 is formed by providing the buried layer 68 as will be described later.

The wiring layer 60W has contact electrodes 69E and dummy electrodes 69ED in, for example, interlayer insulating films 69A and 69B. For example, the interlayer insulating film 69B is arranged on the ROIC substrate 200A side, the interlayer insulating film 69A is arranged on a first contact layer 62 side, and these interlayer insulating films 69A and 69B are stacked. The interlayer insulating films 69A and 69B are made of, for example, inorganic insulating materials. Examples of the inorganic insulating material include silicon nitride (SiN), aluminum oxide ($Al_2O_3$), silicon oxide ($SiO_2$), hafnium oxide ($HfO_2$), and the like The interlayer insulating films 69A and 69B may be made of the same inorganic insulating material.

The contact electrode 69E is provided, for example, in the element region R1. The contact electrode 69E is configured to electrically connect the first electrode 61 and the ROIC substrate 200A, and is provided for each of the pixels P in the element region R1. The adjacent contact electrodes 69E are electrically separated by the buried layer 68 and the interlayer insulating films 69A and 69B. The contact electrode 69E is made of, for example, a copper (Cu) pad, and is exposed to the junction surface S2. The dummy electrode 69ED is provided, for example, in the peripheral region R2. The dummy electrode 69ED is connected to a dummy electrode 72ED of the wiring layer 70W which will be described later. Since the dummy electrode 69ED and the dummy electrode 72ED are provided, the strength of the peripheral region R2 can be improved. The dummy electrode 69ED is formed in the same process as, for example, the contact electrode 69E. The dummy electrode 69ED is made of, for example, a copper (Cu) pad, and is exposed to the junction surface S2.

The first electrode 61 provided between the contact electrode 69E and the semiconductor layer 60S is an electrode (anode) supplied with a voltage for reading out a signal charge (a hole or an electron, hereinafter, the description will be given assuming the signal charge as the hole for convenience) generated in a photoelectric conversion film 63, and is provided in the element region R1 for each of the pixels P. The first electrode 61 is provided to bury the opening of the insulating film 67, and is in contact with the semiconductor layer 60S (more specifically, a diffusion region 62A to be described later). The first electrode 61 is, for example, larger than the opening of the insulating film 67, and the first electrode 61 is partially provided in the buried layer 68. That is, an upper surface (surface on the semiconductor layer 60S side) of the first electrode 61 is in contact with the diffusion region 62A, and a lower surface and a part of a side surface of the first electrode 61 are in contact with the buried layer 68. The adjacent first electrodes 61 are electrically separated by the insulating film 67 and the buried layer 68.

The first electrode 61 is made of, for example, any single substance of titanium (Ti), tungsten (W), titanium nitride (TiN), platinum (Pt), gold (Au), germanium (Ge), palladium (Pd), zinc (Zn), nickel (Ni), and aluminum (Al), or an alloy containing at least one kind of them. The first electrode 61 may be a single film made of such a constituent material or a stacked film obtained by combining two or more kinds. For example, the first electrode 61 is made of a stacked film of titanium and tungsten. The thickness of the first electrode 61 is, for example, several tens nm to several hundred nm.

The semiconductor layer 60S includes, for example, the first contact layer 62, the photoelectric conversion film 63, and the second contact layer 64 from a position closer to the wiring layer 60W. The first contact layer 62, the photoelectric conversion film 63, and the second contact layer 64 have the same planar shape, and end surfaces thereof are arranged at the same position in a plan view.

The first contact layer 62 is provided in common to all the pixels P, for example, and arranged between the insulating film 67 and the photoelectric conversion film 63. The first contact layer 62 is configured to electrically separate the adjacent pixels P, and the first contact layer 62 is provided with, for example, a plurality of the diffusion regions 62A. When the first contact layer 62 is formed using a compound semiconductor material having a band gap larger than a band gap of a compound semiconductor material forming the photoelectric conversion film 63, a dark current can also be suppressed. For example, n-type indium phosphorus (InP) can be used for the first contact layer 62.

The diffusion regions 62A provided on the first contact layer 62 are arranged apart from each other. The diffusion region 62A is arranged for each of the pixels P, and the first electrodes 61 are connected to the diffusion regions 62A, respectively. The diffusion region 62A is also provided in the OPB region R1B. The diffusion region 62A is configured to read out the signal charge generated in the photoelectric conversion film 63 for each of the pixels P, and contains a p-type impurity, for example. Examples of the p-type impurity include zinc (Zn) and the like. As a result, a pn junction interface is formed between the diffusion region 62A and the first contact layer 62 other than the diffusion region 62A, and adjacent pixels P are electrically separated. The diffusion region 62A is provided, for example, in the thickness direction of the first contact layer 62, and is also provided in a part of the photoelectric conversion film 63 in the thickness direction.

The photoelectric conversion film 63 between the first electrode 61 and the second electrode 65, more specifically, between the first contact layer 62 and the second contact layer 64 is provided in common to all the pixels P, for example. The photoelectric conversion film 63 absorbs light having a predetermined wavelength to generate the signal charge, and is made of, for example, a compound semiconductor material such as an i-type group III-V semiconductor. Examples of the compound semiconductor material forming the photoelectric conversion film 63 include indium gallium arsenide (InGaAs), indium arsenide antimony (InAsSb), indium arsenide (InAs), indium antimony (InSb), mercury cadmium telluride (HgCdTe), and the like. The photoelectric conversion film 63 may be made of germanium (Ge). The photoelectric conversion film 63 enables photoelectric conversion of light having wavelengths from the visible region to the short infrared region.

The second contact layer 64 is provided in common to all the pixels P, for example. The second contact layer 64 is provided between the photoelectric conversion film 63 and the second electrode 65, and is in contact with the both. The second contact layer 64 is a region where a charge discharged from the second electrode 65 moves, and is made of, for example, a compound semiconductor containing an n-type impurity. For example, n-type indium phosphorus (InP) can be used for the second contact layer 64.

The second electrode 65 is provided on the second contact layer 64 (light incident side) in contact with the second contact layer 64, for example, as an electrode common to the respective pixels P. The second electrode 65 is configured to discharge a charge that is not used as a signal charge among charges generated in the photoelectric conversion film 63 (cathode). For example, when a hole is read out from the first electrode 61 as the signal charge, for example, an electron can be discharged through the second electrode 65. The second electrode 65 is made of a conductive film capable of transmitting incident light such as an infrared ray. For example, indium tin oxide (ITO), ITiO ($In_2O_3$—$TiO_2$), or the like can be used for the second electrode 65. The second electrodes 65 may be provided in a matrix so as to partition the adjacent pixels P, for example. A conductive material having a low light transmittance can be used for the second electrode 65.

The passivation film 66 covers the second electrode 65 from the light incident surface S1 side. The passivation film 66 may have an antireflection function. For example, silicon nitride (SiN), aluminum oxide ($Al_2O_3$), silicon oxide ($SiO_2$), tantalum oxide ($Ta_2O_3$), and the like can be used for the passivation film 66. The passivation film 66 has an opening 66H in the OPB region R1B. The opening 66H is provided, for example, in a frame shape surrounding the light receiving region (FIG. 9A). The opening 66H may be, for example, a hole having a square or circular shape in a plan view. The conductive film 65B is electrically connected to the second electrode 65 through the opening 66H of the passivation film 66.

The insulating film 67 is provided between the first contact layer 62 and the buried layer 68, covers the end surface of the first contact layer 62, the end surface of the photoelectric conversion film 63, the end surface of the second contact layer 64, and an end surface of the second electrode 65, and is in contact with the passivation film 66 in the peripheral region R2. The insulating film 67 contains, for example, an oxide such as silicon oxide ($SiO_x$) and aluminum oxide ($Al_2O_3$). The insulating film 67 may be formed using a stacked structure including a plurality of films. The insulating film 67 may be made of, for example, a silicon (Si)-based insulating material such as silicon oxynitride (SiON), carbon-containing silicon oxide (SiOC), silicon nitride (SiN), and silicon carbide (SiC). The thickness of the insulating film 67 is, for example, several tens nm to several hundred nm.

The conductive film 65B extends from the OPB region R1B to the hole H1 of the peripheral region R2. The conductive film 65B is in contact with the second electrode 65 at the opening 66H of the passivation film 66 provided in the OPB region R1B, and is also in contact with a wiring (wiring 72CB to be described later) of the ROIC substrate 200A through the hole H1. As a result, a voltage is supplied from the ROIC substrate 200A to the second electrode 65 via the conductive film 65B. The conductive film 65B functions not only as such a voltage supply path to the second electrode 65 but also as a light shielding film, and forms the OPB region R1B. The conductive film 65B is made of a metal material containing, for example, tungsten (W), aluminum (Al), titanium (Ti), molybdenum (Mo), tantalum (Ta), or copper (Cu). A passivation film may be provided on the conductive film 65B.

An adhesive layer B may be provided between an end portion of the second contact layer 64 and the second electrode 65. The adhesive layer B is used at the time of forming the imaging element 1A as will be described later, and serves as a role of joining the semiconductor layer 60S to a temporary substrate. The adhesive layer B is made of, for example, tetraethoxysilane (TEOS), silicon oxide ($SiO_2$), or the like. The adhesive layer B is provided wider than an end surface of the semiconductor layer 60S, and is covered with the buried layer 68 together with the semiconductor layer 60S. The insulating film 67 is formed between the adhesive layer B and the buried layer 68.

The buried layer 68 fills a step between the temporary substrate and the semiconductor layer 60S in a manufacturing process of the imaging element 1A. Although details will be described later, the occurrence of a defect in the manufacturing process caused by the step between the semiconductor layer 60S and the temporary substrate is suppressed since the buried layer 68 is formed in the present embodiment.

The buried layer 68 in the peripheral region R2 is provided between the wiring layer 60W and the insulating film 67 and between the wiring layer 60W and the passivation film 66, and has the thickness equal to or larger than the thickness of the semiconductor layer 60S, for example. Here, the buried layer 68 surrounds the semiconductor layer 60S, and thus, the region (peripheral region R2) around the semiconductor layer 60S is formed. As a result, the junction surface S2 with the ROIC substrate 200A can be provided in the peripheral region R2. The thickness of the buried layer 68 may be reduced as long as the junction surface S2 is formed in the peripheral region R2, but it is preferable that the buried layer 68 cover the semiconductor layer 60S in the thickness direction such that the entire end surface of the semiconductor layer 60S is covered with the buried layer 68. The buried layer 68 covers the entire end surface of the semiconductor layer 60S with the insulating film 67 interposed therebetween, thereby effectively suppressing intrusion of moisture into the semiconductor layer 60S. The buried layer 68 in the element region R1 is provided between the semiconductor layer 60S and the wiring layer 60W so as to cover the first electrode 61.

A surface of the buried layer 68 on the junction surface S2 side is planarized, and the wiring layer 60W is provided on the planarized surface of the buried layer 68 in the peripheral region R2. For example, an inorganic insulating material such as silicon oxide ($SiO_x$), silicon nitride (SiN), silicon oxynitride (SiON), carbon-containing silicon oxide (SiOC), and silicon carbide (SiC) can be used for the buried layer 68.

For example, in the process of manufacturing the imaging element 1A, the buried layer 68 is formed, and thereafter, the wiring layer 60W including the interlayer insulating films 69A and 69B and the contact electrode 69E is formed above the buried layer 68. The ROIC substrate 200A including the wiring layer 70W is bonded to the photoelectric conversion unit 100A including the wiring layer 60W to form the imaging element 1A. At this time, the contact electrode 69E of the wiring layer 60W and a contact electrode 72E of the wiring layer 70W are connected. The contact electrodes 69E and 72E have, for example, Cu pads, and the contact electrodes 69E and 72E are connected by directly joining these Cu pads. When the contact electrode 69E is formed using a chemical mechanical polishing (CMP) method, the buried layer 68 arranged below a copper film to be polished is required to have hardness that can withstand stress during polishing. In addition, it is necessary to form the photoelectric conversion unit 100A and the ROIC substrate 200A to be extremely flat in order to directly join the Cu pads of the contact electrodes 69E and 72E. Thus, the buried layer 68 arranged below the copper film preferably has hardness capable of withstanding stress during polishing. Specifically, a constituent material of the buried layer 68 is preferably a material having higher hardness than a sealant or an organic material arranged around a die in a general semiconductor package. Examples of such a material having high hardness include an inorganic insulating material. The buried layer 68 can be formed by depositing the inorganic insulating material by, for example, a chemical vapor deposition (CVD) method, a sputtering method, or a coating method.

The buried layer 68 has the holes H1 and H2 penetrating through the buried layer 68. The holes H1 and H2 penetrate through the wiring layer 60W as well as the buried layer 68 and reach the ROIC substrate 200A. The holes H1 and H2 have, for example, a square planar shape, and a plurality of the holes H1 and a plurality of the holes H2 are provided so as to surround the element region R1 (FIG. 9A). The hole H1 is provided at a position closer to the element region R1 than the hole H2, and a side wall and a bottom surface of the hole H1 are covered with the conductive film 65B. The hole H1 is configured to connect the second electrode 65 (conductive film 65B) and the wiring (wiring 72CB) of the ROIC substrate 200A, and penetrates through the passivation film 66, the buried layer 68, and the wiring layer 60W.

The hole H2 is provided at a position closer to a chip end E than the hole H1. The hole H2 penetrates through the passivation film 66, the buried layer 68, and the wiring layer 60W and reaches a pad electrode (pad electrode 72P to be described later) of the ROIC substrate 200A. The outside and the imaging element 1A are electrically connected through the hole H2. The holes H1 and H2 do not necessarily reach the ROIC substrate 200A. For example, the holes H1 and H2 may reach a wiring of the wiring layer 60W, and this wiring may be connected to the wiring 72CB and the pad electrode 72P of the ROIC substrate 200A. The holes H1 and H2 may penetrate through the adhesive layer B.

The hole and electron generated in the photoelectric conversion film 63 are read out from the first electrode 61 and the second electrode 65. In order to perform such a readout operation at a high speed, the distance between the first electrode 61 and the second electrode 65 is set to preferably the distance that is sufficient for photoelectric conversion and is not excessively long. That is, it is preferable to reduce the thickness of the photoelectric conversion unit 100A. For example, the distance between the first electrode 61 and the second electrode 65 or the thickness of the photoelectric conversion unit 100A is equal to or less than 10 μm, further equal to or less than 7 μm, and further equal to or less than 5 μm.

The semiconductor substrate 71 of the ROIC substrate 200A faces the photoelectric conversion unit 100A with the wiring layer 70W and the multilayer wiring layer 72C interposed therebetween. The semiconductor substrate 71 is made of silicon (Si), for example. A plurality of transistors are provided in the vicinity of a surface (surface on the wiring layer 70W side) of the semiconductor substrate 71. For example, the plurality of transistors correspond to the OFG transistor Tofg, the transfer transistor Ttrg, the reset transistor Trst, the amplification transistor Tamp, and the selection transistor Tsel in the pixel readout circuit 20 (FIG. 3).

The wiring layer 70W has an interlayer insulating film 72A and an interlayer insulating film 72B in this order, for example, from the photoelectric conversion unit 100A side, and these interlayer insulating films 72A and 72B are stacked. For example, the contact electrode 72E and the dummy electrode 72ED are provided in the interlayer insulating film 72A. The multilayer wiring layer 72C is provided to face the photoelectric conversion unit 100A with the wiring layer 70W interposed therebetween. For example, the pad electrode 72P and a plurality of the wirings 72CB are provided in the multilayer wiring layer 72C. The interlayer insulating films 72A and 72B are made of, for example, an inorganic insulating material. Examples of the inorganic insulating material include silicon nitride (SiN), aluminum oxide ($Al_2O_3$), silicon oxide ($SiO_2$), hafnium oxide ($HfO_2$), and the like The contact electrode 72E is configured to electrically connect the first electrode 61 and the wiring 72CB, and is provided for each of the pixels P in the element region R1. The contact electrode 72E is in contact with the contact electrode 69E at the junction surface S2 of the photoelectric conversion unit 100A. The adjacent contact electrodes 72E are electrically separated by the interlayer insulating film 72A.

The dummy electrode 72ED provided in the peripheral region R2 is in contact with the dummy electrode 69ED at the junction surface S2 of the photoelectric conversion unit 100A. The dummy electrode 72ED is formed in the same process as the contact electrode 72E, for example. The contact electrode 72E and the dummy electrode 72ED are made of, for example, copper (Cu) pads, and are exposed to a surface of the ROIC substrate 200A facing the photoelectric conversion unit 100A. That is, for example, Cu—Cu bonding is obtained between the contact electrode 69E and the contact electrode 72E and between the dummy electrode 69ED and the dummy electrode 72ED. Since the photoelectric conversion unit 100A having the photoelectric conversion film 63 and the ROIC substrate 200A having the pixel readout circuit 20 and predetermined wirings are separately manufactured and joined by Cu—Cu bonding, and thus, the pixel P can be downsized.

The wiring 72CB connected to the contact electrode 69E is connected to a transistor provided in the vicinity of the surface of the semiconductor substrate 71, and the first electrode 61 is connected to the pixel readout circuit. The wiring 72CB connected to the conductive film 65B through the hole H1 is connected, for example, to a predetermined potential. In this manner, one (for example, the hole) of the charges generated in the photoelectric conversion film 63 is read out from the first electrode 61 to the pixel readout circuit through the contact electrodes 69E and 72E, and the other (for example, the electron) of the charges generated in the photoelectric conversion film 63 is discharged to the predetermined potential from the second electrode 65 through the conductive film 65B.

The pad electrode 72P provided in the peripheral region R2 is configured for electrical connection with the outside. The hole H2 penetrating through the photoelectric conversion unit 100A and reaching the pad electrode 72P is formed in the vicinity of the chip end E of the imaging element 1A, and the electrical connection with the outside is achieved through the hole H2. The connection is achieved, for example, by a method such as wire bond or bump. For example, a predetermined potential may be supplied to the second electrode 65 from an external terminal arranged in the hole H2 through the wiring 72CB of the ROIC substrate 200A and the conductive film 65B. It may be configured such that a signal voltage, which has been read out from the first electrode 61 as a result of the photoelectric conversion by the photoelectric conversion film 63, is read out to a readout circuit through the contact electrodes 69E and 72E, and is output to the external terminal arranged in the hole H2 via the readout circuit. The signal voltage may be output from the readout circuit to the external terminal via the load transistor unit LMD (LMU), the comparator circuit unit CMU (CMD), the counter unit CNU (CND), and the like.

In the ROIC substrate 200A of the imaging element 1A according to the present embodiment, the OFG transistor Tofg, the transfer transistor Ttrg, the reset transistor Trst, the amplification transistor Tamp, and the selection transistor Tsel are formed on the semiconductor substrate 71. In addition, the wirings L1 and L2, the switching unit SW that selectively connects the wirings L1 and L2 to the wiring LV, the wiring $LD_{VDR}$ that connects the wiring LV to a drain of the reset transistor Trst via the wiring $L_{VDR}$, and the wiring $LO_{VDR}$ that connects the wiring LV to a drain of the OFG transistor Tofg via the wiring $L_{VDR}$ are formed on the multilayer wiring layer 72C. That is, the pixel readout circuit 20 (FIG. 3) is provided for each of the pixels P on the ROIC substrate 200A of the imaging element 1A according to the present embodiment.

Thus, the operations described with reference to FIG. 4 can be executed even in the ROIC substrate 200A of the imaging element 1A according to the present embodiment. Therefore, the imaging element 1A according to the present embodiment exhibits the same effects as those of the imaging element 1 according to the first embodiment.

Note that the multilayer wiring layer 72C in the ROIC substrate 200A may be provided with the switching unit SWA, instead of the switching unit SW, and a wiring (see FIG. 5) corresponding to the switching unit SWA. In addition, the switching unit SWB may be provided, instead of the switching unit SW of the switching unit SW, and a wiring (see FIG. 6) corresponding to the switching unit SWB may be provided. These also enables the execution of the evaluation operations described with reference to FIG. 4. Therefore, the ROIC substrate 200A can be evaluated regardless of whether the photoelectric conversion unit 100A is irradiated with light even before the photoelectric conversion unit 100A is joined to the ROIC substrate 200A.

In addition, the multilayer wiring layer 72C of the ROIC substrate 200A may be provided with the pixel readout circuit 20A (see FIG. 7), the switching unit SW corresponding thereto, and a wiring corresponding to the switching unit SW. As a result, the operations described with reference to FIG. 8 can be executed.

Fourth Embodiment

Figure 10:
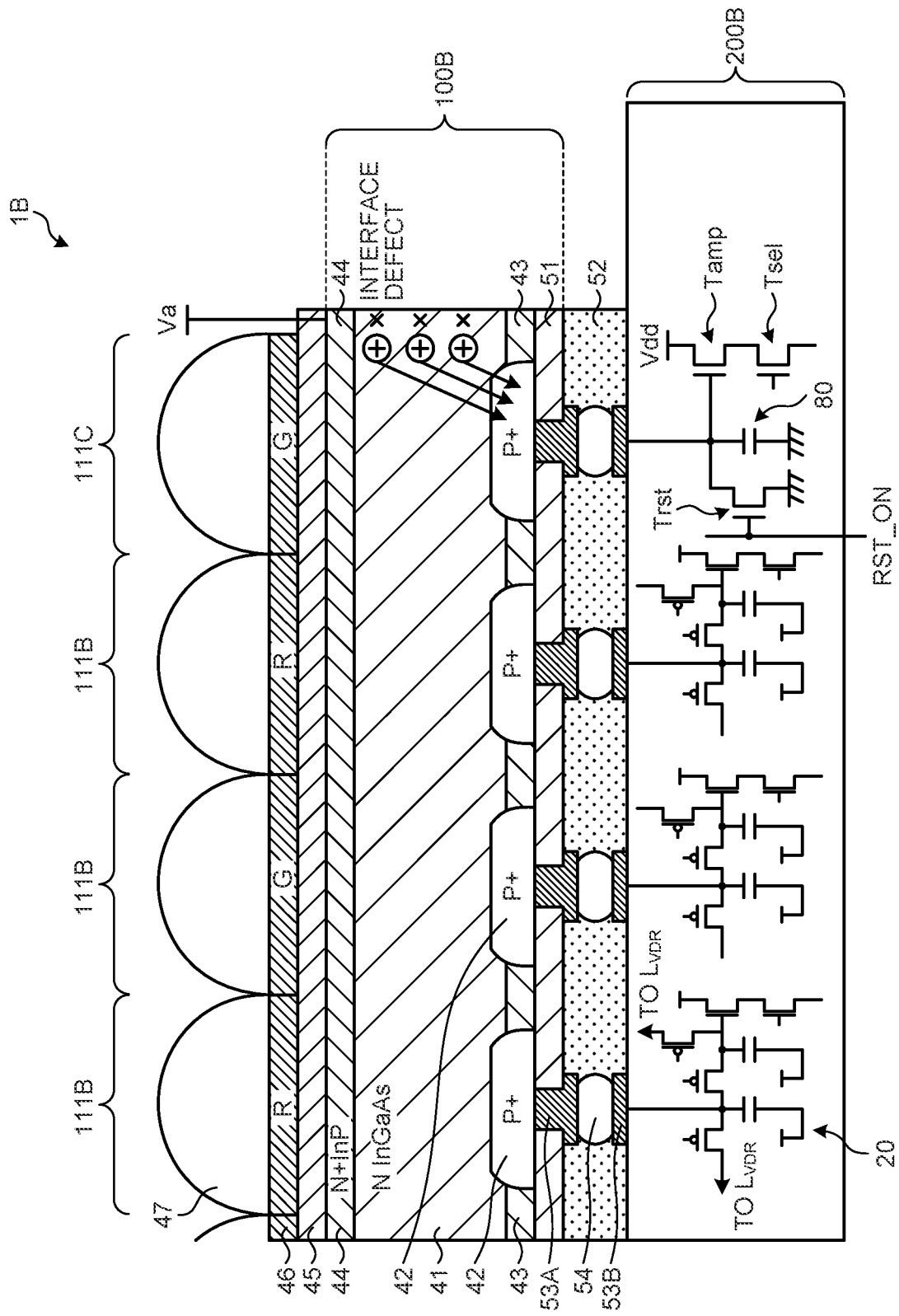
FIG. 10 is a partial cross-sectional view schematically illustrating an imaging element according to a fourth embodiment.
Figure 11:
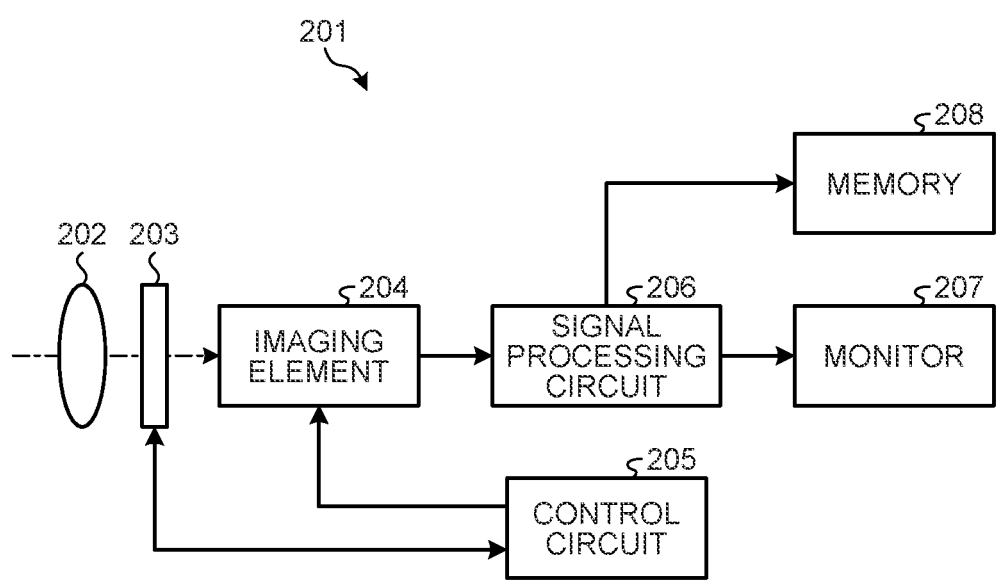
FIG. 11 is a schematic diagram illustrating an electronic device to which an imaging element according to an embodiment of the present disclosure is applicable.

Next, an imaging element according to a fourth embodiment of the present disclosure will be described. FIG. 10 is a partial cross-sectional view schematically illustrating an imaging element 1B according to the fourth embodiment. As illustrated in the drawing, the imaging element 1B according to the present embodiment includes a photoelectric conversion unit 100B and an ROIC substrate 200B joined to the photoelectric conversion unit 100B.

Even in the ROIC substrate 200B of the imaging element 1B according to the present embodiment, the pixel readout circuit 20 described with reference to FIG. 3 is formed for each of pixels 111B. However, reference signs of transistors and capacitors included in the pixel readout circuit 20 are omitted in FIG. 10. In addition, the switching unit SW and the wirings LV, L1, and L2 illustrated in FIG. 3 are omitted in FIG. 10.

An N-type photoelectric conversion film 41 is formed on the entire surface of the photoelectric conversion unit 100B. The photoelectric conversion film 41 is made of InGaAs in the present embodiment. However, the photoelectric conversion film 41 can be formed using a compound semiconductor having a chalcopyrite structure, such as InGaP, InAlP, and InAlAs, without being limited to InGaAs. The compound semiconductor having the chalcopyrite structure is a material capable of obtaining a high light absorption coefficient and high sensitivity over a wide wavelength region, and is preferably used as the photoelectric conversion film 41. Such a compound semiconductor having the chalcopyrite structure is formed using elements such as Cu, Al, Ga, In, S, and Se, and examples thereof include CuGaInS mixed crystals, CuAlGaInS mixed crystals, and CuAlGaInSSe mixed crystals, and the like, In addition, amorphous silicon (Si), germanium (Ge), a quantum dot photoelectric conversion film, an organic photoelectric conversion film, and the like, are exemplified as a material of the photoelectric conversion film 41 in addition to the compound semiconductor described above.

A P-type layer 42 having a high acceptor concentration, which forms a pixel electrode, is formed for each of the pixels 111B on the lower side (ROIC substrate 200B side) of the photoelectric conversion film 41. Further, an N-type layer 43 as a pixel separation region, which separates the respective pixels 111B, is formed using a compound semiconductor such as InP, for example, between the P-type layers 42 having a high acceptor concentration and formed for each of the pixels 111B. The N-type layer 43 has not only the function as the pixel separation region but also as a role of preventing a dark current.

Meanwhile, an N-type layer 44 having a higher donor concentration than the photoelectric conversion film 41 is also formed on the upper side (light incident side) of the photoelectric conversion film 41 as a pixel separation region using a compound semiconductor such as InP. The N-type layer 44 having a high donor concentration functions as a barrier layer that prevents reverse flow of a charge generated by the photoelectric conversion film 41. The N-type layer 44 having a high donor concentration can be formed, for example, using a compound semiconductor such as InGaAs, InP, and InAlAs.

An antireflection film 45 is formed on the N-type layer 44 having a high donor concentration as a barrier layer. The antireflection film 45 can be formed using, for example, silicon nitride (SiN), hafnium oxide ($HfO_2$), aluminum oxide ($Al_2O_3$), zirconium oxide ($ZrO_2$), tantalum oxide ($Ta_2Ta_5$), titanium oxide ($TiO_2$), or the like.

Any one of the N-type layer 44 having a high donor concentration and the antireflection film 45 also functions as an upper electrode on the upper side among electrodes vertically sandwiching the photoelectric conversion film 41. A predetermined voltage Va is applied to the N-type layer 44 having a high donor concentration or the antireflection film 45 serving as the upper electrode.

A color filter 46 and an on-chip lens 47 are further formed on the antireflection film 45. The color filter 46 is a filter that transmits light (wavelength light) of any of red (R), green (G), and blue (B), and is arranged according to a so-called Bayer array in the pixel array 110 (FIG. 2), for example.

A passivation layer 51 is formed on the lower side of the P-type layer 42 having a high acceptor concentration, which forms the pixel electrode, and the N-type layer 43 serving as the pixel separation region. Further, a connection electrode 53A is formed so as to penetrate through the passivation layer 51.

The connection electrode 53A is electrically connected to a connection electrode 53B formed on an upper surface of the ROIC substrate 200B via a bump electrode 54. As a result, the P-type layer 42 having a high acceptor concentration, which forms the pixel electrode, in the photoelectric conversion unit 100B is electrically connected to the pixel readout circuit 20. In addition, the photoelectric conversion unit 100B is mechanically joined to the ROIC substrate 200B by connecting the connection electrode 53A and the connection electrode 53B via the bump electrode 54. Note that regions among the connection electrode 53A, the bump electrode 54, and the connection electrode 53B connected to each other are filled with an insulating layer 52. As a result, the photoelectric conversion unit 100B and the ROIC substrate 200B can be firmly joined.

Since the imaging element 1B according to the present embodiment having the above configuration includes the pixel readout circuit 20 similarly to the imaging element 1 in the first embodiment, the evaluation operations described with reference to FIG. 4 can be executed. Therefore, the ROIC substrate 200B can be evaluated regardless of whether the photoelectric conversion unit 100B is irradiated with light even before the photoelectric conversion unit 100B is joined to the ROIC substrate 200B. Note that the ROIC substrate 200B of the imaging element 1B may be provided with the pixel readout circuit in the imaging element according to the modification of the first embodiment or the second embodiment, instead of the pixel readout circuit 20 in the imaging element 1 according to the first embodiment. Even in such a case, the ROIC substrate 200B can be evaluated regardless of whether the photoelectric conversion unit 100B is irradiated with light even before the photoelectric conversion unit 100B is joined to the ROIC substrate 200B.

Note that the imaging element 1B includes the pixels 111B and pixels 111C different therefrom. The pixel 111B is a pixel that outputs a charge signal based on a charge generated by photoelectric conversion and contributes to image formation.

On the other hand, the pixels 111C are arrayed so as to surround the pixels 111B arrayed in a matrix, for example, in a peripheral edge portion of the pixel array 110 (FIG. 2). The pixel 111C has a pixel readout circuit 20C. The pixel readout circuit 20C is formed on the ROIC substrate 200B and includes a capacitive element 80, the reset transistor Trst, the amplification transistor Tamp, and the selection transistor Tsel. In addition, the pixel 111C is different from the pixel 111B in that a gate voltage is always applied to a gate of the reset transistor Trst. Thus, the charge generated by the photoelectric conversion at the pixel 111C can be discharged to the ground through the reset transistor Trst.

In the pixel 111 C formed in the peripheral edge portion of the rectangular pixel array 110 (FIG. 2), an interface defect or the like occurs at a processed portion interface (processed portion end surface) of the photoelectric conversion film 41 as illustrated in FIG. 3 so that a dark current is likely to occur due to the influence of the interface defect or the like. In particular, in a case where a readout circuit formed on the ROIC substrate 200B is a circuit of a source follower type, a potential difference of a pixel decreases as a charge is accumulated, and thus, a dark current component affects the adjacent pixel 111B one after another due to blooming. In the present embodiment, the reset transistor Trst can be constantly turned on in the pixel 111C. Therefore, the charge generated in the pixel 111C can be discharged to the ground, and the inflow of the charge into the pixel 111B can be reduced.

Note that the pixels 111C may be formed in a plurality of rows and a plurality of columns other than in one row and one column on the outermost side of the rectangular pixel array 110.

The present disclosure has been described with reference to several embodiments, but the present disclosure is not limited to the above-described embodiments, and various changes and modifications can be made.

For example, in the first embodiment (including the second modification (FIG. 6)) and the second embodiment, the wiring LV, the wiring L1, the wiring L2, the wiring L3, and the switching unit SW (SWB) are provided in both the load transistor units LMU and LMD (see FIG. 2), but the wirings LV, L1, L2, and L3 and the switching unit SW (SWB) may be provided in any one of the load transistor units LMU and LMD without being limited thereto. In such a case, however, it is necessary to form the load transistor units LMU and LMD respectively in separate manufacturing processes. On the other hand, in a case where the wirings LV, L1, L2, and L3 and the switching unit SW (SWB) are provided in both the load transistor units LMU and LMD, the load transistor units LMU and LMD can be formed in the same manufacturing process, and thus, the number of manufacturing processes can be reduced.

In addition, in a case where only one of the load transistor units LMU and LMD is provided due to the limitation of a size of the ROIC substrate 200, the wirings LV, L1, L2, and L3 and the switching unit SW (SWB) may be provided in the provided load transistor unit.

Further, the wirings LV, L1, L2, and L3 and the switching unit SW (SWB) may be appropriately formed in, for example, a region where the density of circuit elements, such as wirings, vias, and transistors, is low in the ROIC substrate 200 without being provided in the load transistor unit LMU and/or LMD.

In addition, the wirings LV and L1 and the switching unit SWA may be provided in any one of the load transistor units LMU and LMD, or may be appropriately formed in a region where the density of circuit elements is low similarly in the first modification (FIG. 5) of the first embodiment.

In addition, in a case where the switching unit SW (SWA, SWB) is provided in both the load transistor units LMU and LMD, for example, the wiring L1 and the wiring L2 provided in the load transistor unit LMU and the wiring L1 and the wiring L2 provided in the load transistor unit LMD may be connected, respectively. As a result, the number of pads connected to the wiring L1 and the number of pads connected to the wiring L2 can be reduced.

For example, a CMOS image sensor or a CCD image sensor may be combined with the ROIC substrate in the embodiments of the present disclosure without being limited to the photoelectric conversion unit 100 formed using the group III-V compound semiconductor. The above effects can also be exhibited in an imaging element obtained by such a combination. In addition, such an imaging element can be applied to, for example, a steel camera or a video camera, and thus, it is also possible to improve the reliability of the steel camera or the video camera by applying the imaging element subjected to the evaluation by the above-described evaluation operations.

Further, the ROIC substrate 200 according to the embodiment of the present disclosure can also be provided with a circuit (sometimes referred to as a dummy source follower) that outputs a signal, equivalent to a signal from a pixel to a vertical signal line, in a pseudo manner. Accordingly, the ROIC substrate 200 can be also evaluated for other evaluation items different from the evaluation described with reference to the time charts in FIGS. 4 and 8.

Note that, as described with reference to the time chart of FIG. 4, the evaluation of the ROIC substrate of the imaging element according to the first embodiment (including the modification) of the present disclosure is performed by changing the voltage Vfd of the floating diffusion layer FD from the voltage VDR2 (1.2 V) to (voltage VDR1+voltage VDR2)/2 different from the voltage VDR2, reading out the voltage of the floating diffusion layer FD in this state, changing the voltage Vfd of the floating diffusion layer FD to the voltage VDR2, and reading out the voltage Vfd of the floating diffusion layer FD again. In addition, as described with reference to the time chart of FIG. 8, the evaluation of the ROIC substrate of the imaging element according to the second embodiment of the present disclosure is performed by changing the voltage Vfd of the floating diffusion layer FD from the voltage VDR2 (1.2 V) to the voltage VDR1 different from the voltage VDR2, reading out the voltage of the floating diffusion layer FD in this state, changing the voltage Vfd of the floating diffusion layer FD to the voltage VDR2, and reading out the voltage Vfd of the floating diffusion layer FD again.

In addition, the term of the column direction in the above description is used only for the convenience of the description, and is not used to clearly distinguish between the vertical direction and the horizontal direction. For example, in the above-described embodiments (including the modifications), the single switching unit SW (SWA or SWB) is provided for the plurality of pixels arrayed in the column direction, but it is a matter of course that the single switching unit SW (SWA or SWB) may be provided for a plurality of pixels arrayed in a row direction.

Application Example

The imaging elements according to the embodiments of the present disclosure described above can be applied to various electronic devices, for example, an imaging device such as a digital still camera and a digital video camera, a mobile phone having an imaging function, or another device having an imaging function.

Figure 14:
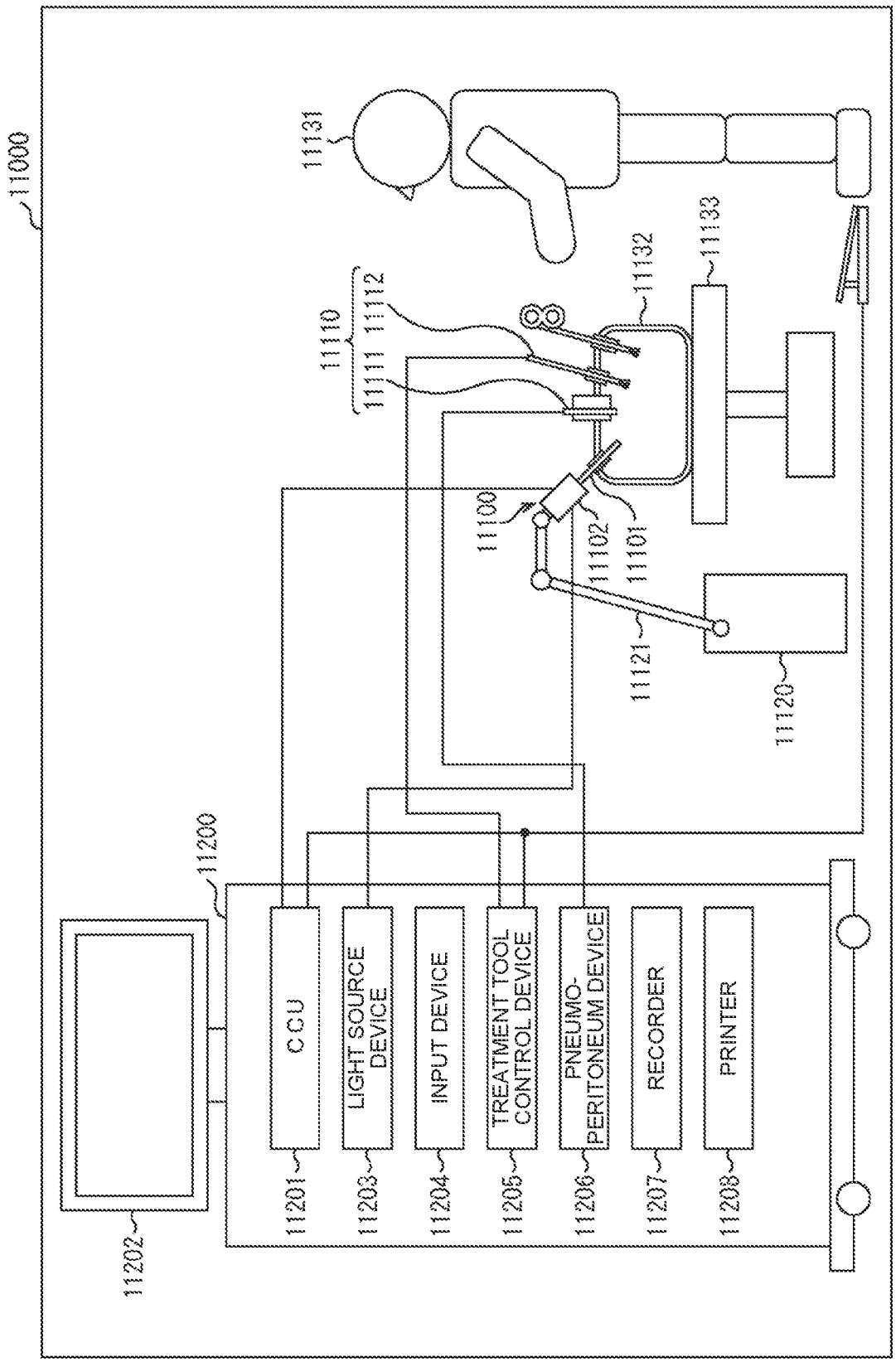
FIG. 14 is a diagram illustrating an example of a schematic configuration of an endoscopic surgery system.

FIG. 14 is a block diagram illustrating a configuration example of the imaging device as the electronic device to which the present technology has been applied. An imaging device 201 illustrated in FIG. 14 includes an optical system 202, a shutter device 203, an imaging element 204, a drive circuit 205, a signal processing circuit 206, a monitor 207, and a memory 208, and can capture a still image or a moving image.

The optical system 202 includes one or a plurality of lenses, guides light (incident light) from a subject to the imaging element 204, and forms an image on a light receiving surface of the imaging element 204.

The shutter device 203 is arranged between the optical system 202 and the imaging element 204, and controls a light irradiation period and a light shielding period with respect to the imaging element 204 according to the control of the drive circuit 1005.

The imaging element 204 includes the imaging element according to each of the above-described embodiments (including the modifications). The imaging element 204 accumulates signal charges for a certain period according to the light formed on the light receiving surface via the optical system 202 and the shutter device 203. The signal charge accumulated in the imaging element 204 is transferred in accordance with a drive signal (timing signal) supplied from the drive circuit 205.

The drive circuit 205 outputs a drive signal for controlling a transfer operation of the imaging element 204 and a shutter operation of the shutter device 203 to drive the imaging element 204 and the shutter device 203.

The signal processing circuit 206 performs various types of signal processing on a signal charge output from the imaging element 204. An image (image data) obtained by performing the signal processing by the signal processing circuit 206 is supplied to and displayed on the monitor 207, or supplied to and stored (recorded) in the memory 208.

Since the imaging element 204 includes the imaging element according to each of the above-described embodiments (including modifications) in the imaging device 201 configured as described above, the imaging device 201 can be manufactured using the imaging element 204 whose reliability has been confirmed through the evaluation operations as described above. That is, the imaging elements according to the embodiments of the present disclosure contribute to improvement of the reliability of the electronic device as the imaging device using the same.

Other Application Example 1

The technology according to the present disclosure (the present technology) can be applied to various products. For example, the technology according to the present disclosure may be implemented as a device mounted on a moving object of any type such as a vehicle, an electric vehicle, a hybrid electric vehicle, a motorcycle, a bicycle, a personal mobility, an airplane, a drone, a ship, and a robot.

Figure 12:
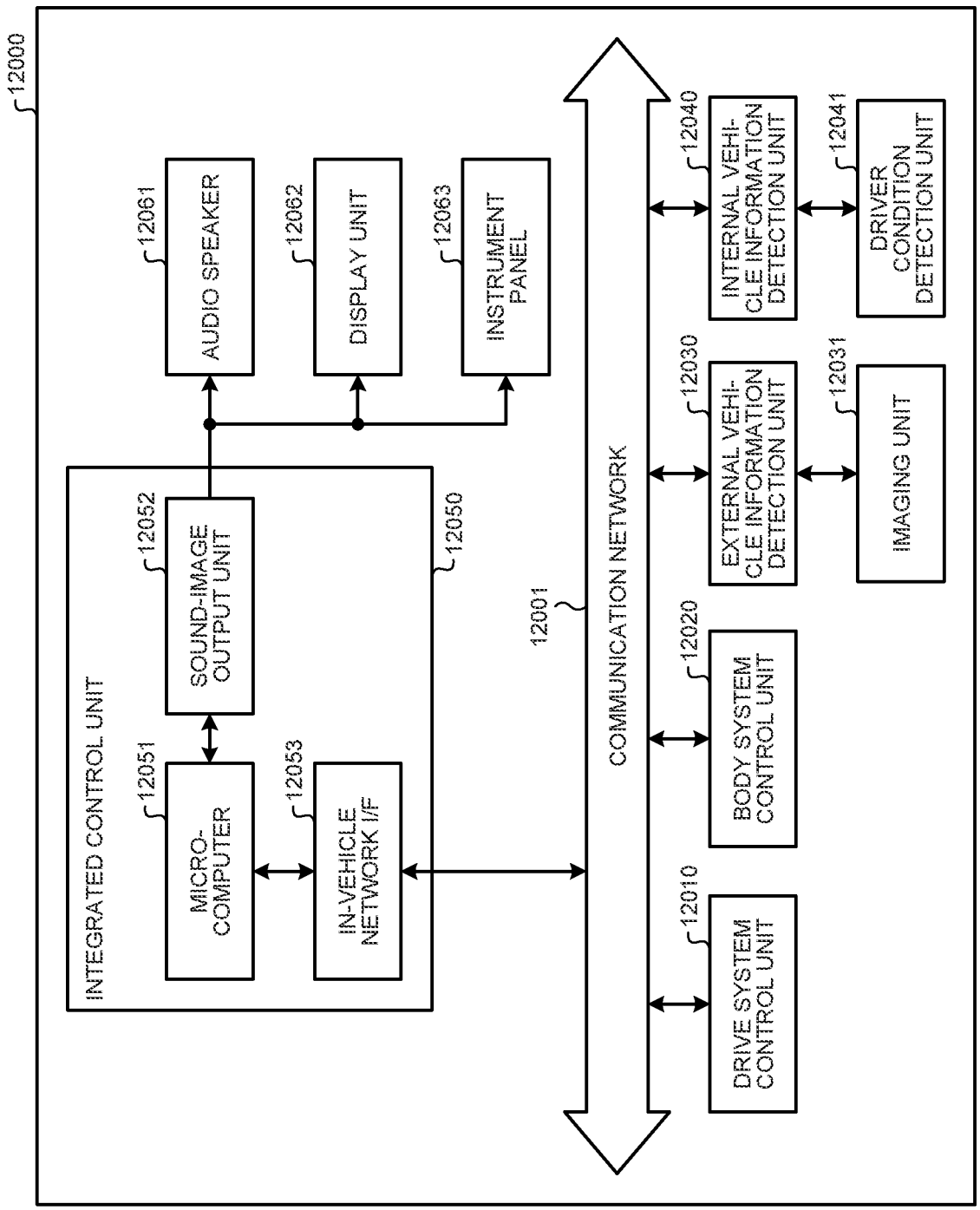
FIG. 12 is a block diagram illustrating an example of a schematic configuration of a vehicle control system to which the technology according to the present disclosure can be applied.

FIG. 12 is a block diagram illustrating a schematic configuration example of a vehicle control system, which is an example of a moving object control system to which the technology according to the present disclosure can be applied.

A vehicle control system 12000 includes a plurality of electronic control units connected via a communication network 12001. In the example illustrated in FIG. 12, the vehicle control system 12000 includes a drive system control unit 12010, a body system control unit 12020, an external vehicle information detection unit 12030, an internal vehicle information detection unit 12040, and an integrated control unit 12050. In addition, as a functional configuration of the integrated control unit 12050, a microcomputer 12051, a sound-image output unit 12052, and an in-vehicle network interface (I/F) 12053 are illustrated.

The drive system control unit 12010 controls operations of devices related to a drive system of a vehicle according to various programs. For example, the drive system control unit 12010 functions as a control device of a driving force generation device, such as an internal combustion engine and a driving motor, configured to generate a driving force of the vehicle, a driving force transmitting mechanism configured to transmit the driving force to wheels, a steering mechanism that adjusts a steering angle of the vehicle, a braking device that generates a braking force of the vehicle, and the like.

The body system control unit 12020 controls operations of various devices mounted on a vehicle body according to various programs. For example, the body system control unit 12020 functions as a control device of a keyless entry system, a smart key system, a power window device, or various lamps such as a head lamp, a back lamp, a brake lamp, a turn signal, and a fog lamp. In this case, the body system control unit 12020 can receive input of radio waves transmitted from a portable device substituted for a key or signals of various switches. The body system control unit 12020 receives input of these radio waves or signals to control a door lock device, the power window device, the lamps, or the like of the vehicle.

The external vehicle information detection unit 12030 detects information regarding the outside of the vehicle on which the vehicle control system 12000 is mounted. For example, an imaging unit 12031 is connected to the external vehicle information detection unit 12030. The external vehicle information detection unit 12030 causes the imaging unit 12031 to capture an image of the outside of the vehicle and receives the captured image. The external vehicle information detection unit 12030 may perform object detection processing or distance detection processing of a person, a car, an obstacle, a sign, a character on a road surface, or the like based on the received image.

The imaging unit 12031 is an optical sensor that receives light and outputs an electrical signal according to the amount of the received light. The imaging unit 12031 can output the electrical signal as an image and also as ranging information. In addition, the light received by the imaging unit 12031 may be visible light or invisible light such as infrared light.

The internal vehicle information detection unit 12040 detects internal vehicle information. The internal vehicle information detection unit 12040 is connected with a driver condition detection unit 12041 that detects a condition of a driver, for example. The driver condition detection unit 12041 includes a camera that captures an image of the driver, for example, and the internal vehicle information detection unit 12040 may calculate a degree of fatigue or a degree of concentration of the driver or may determine whether the driver is dozing off based on detection information input from the driver condition detection unit 12041.

The microcomputer 12051 can calculate a control target value of the driving force generation device, the steering mechanism, or the braking device based on the information regarding the inside or outside of the vehicle acquired by the external vehicle information detection unit 12030 or the internal vehicle information detection unit 12040, and output a control command to the drive system control unit 12010. For example, the microcomputer 12051 can perform cooperative control for the purpose of implementing a function of an advanced driver assistance system (ADAS) including collision avoidance or impact mitigation for the vehicle, travel following a vehicle ahead based on an inter-vehicle distance, constant speed travel, a vehicle collision warning, a warning for the vehicle deviating a lane, or the like.

In addition, the microcomputer 12051 can perform cooperative control for the purpose of automated driving or the like with which the vehicle travels autonomously without depending on the driver's operation by controlling the driving force generation device, the steering mechanism, the braking device, or the like based on information regarding the surroundings of the vehicle acquired by the external vehicle information detection unit 12030 or the internal vehicle information detection unit 12040.

In addition, the microcomputer 12051 can output a control command to the body system control unit 12020 based on the information regarding the outside of the vehicle acquired by the external vehicle information detection unit 12030. For example, the microcomputer 12051 can perform cooperative control for the purpose of anti-glare such as switching from a high beam to a low beam by controlling a head lamp depending on a position of a vehicle ahead or an oncoming vehicle detected by the external vehicle information detection unit 12030.

The sound-image output unit 12052 transmits an output signal of at least one of a sound or an image to an output device that can visually or aurally provide notification of information to a passenger of the vehicle or the outside of the vehicle. In the example of FIG. 12, an audio speaker 12061, a display unit 12062, and an instrument panel 12063 are exemplified as the output device. The display unit 12062 may include at least one of an on-board display and a head-up display, for example.

Figure 13:
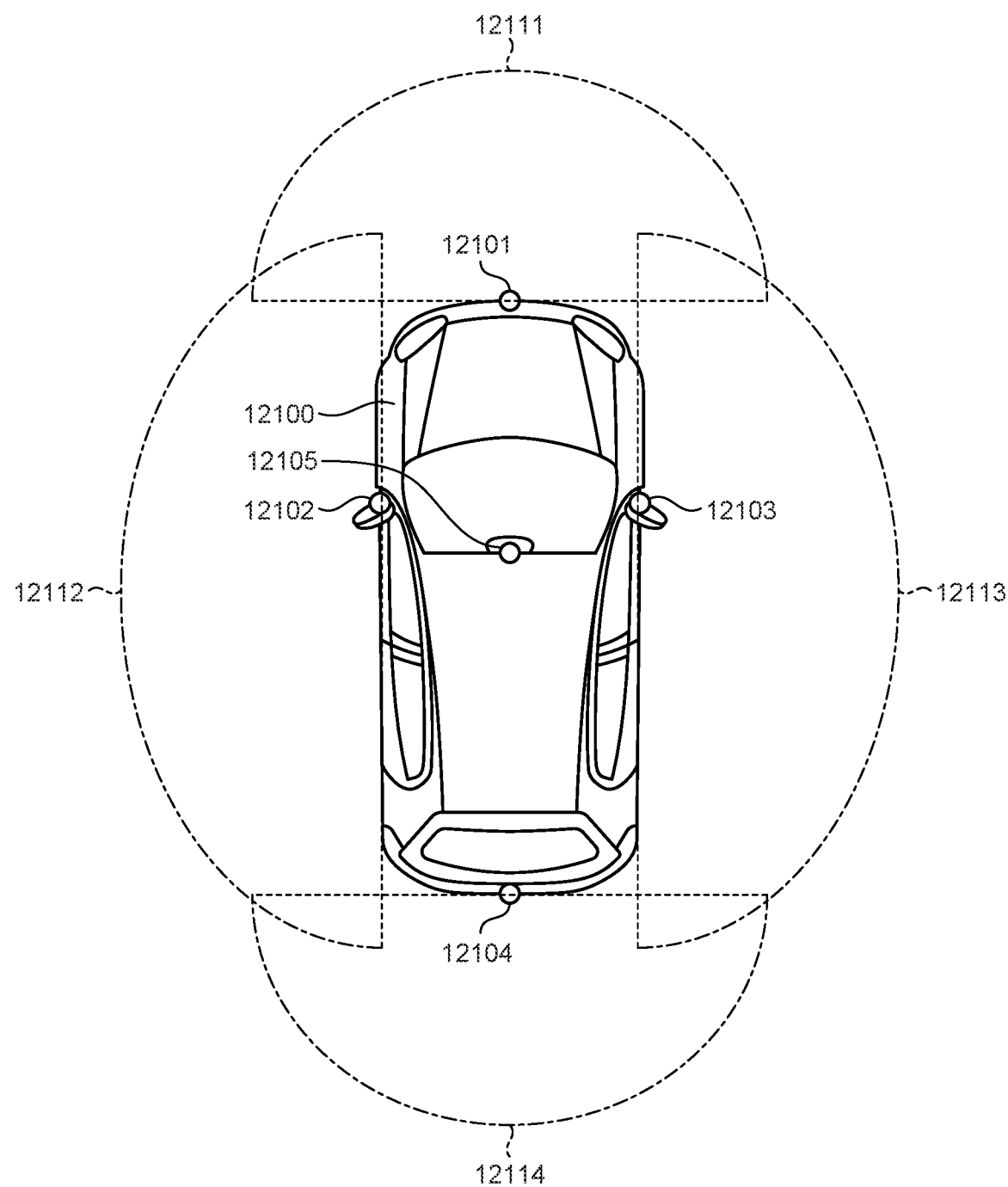
FIG. 13 is an explanatory diagram illustrating an example of an installation position of an external vehicle information detection unit and an imaging unit.

FIG. 13 is a view illustrating an example of an installation position of the imaging unit 12031.

In FIG. 13, imaging units 12101, 12102, 12103, 12104, and 12105 are provided as the imaging unit 12031.

The imaging units 12101, 12102, 12103, 12104, and 12105 are installed at positions such as a front nose, side mirrors, a rear bumper, a back door, and an upper part of a windshield in a passenger compartment of a vehicle 12100, for example. The imaging unit 12101 installed at the front nose and the imaging unit 12105 installed in the upper part of the windshield in the passenger compartment mainly acquire an image of an area in front of the vehicle 12100. The imaging units 12102 and 12103 installed on the side mirrors mainly acquire images of the sides of the vehicle 12100. The imaging unit 12104 installed on the rear bumper or the back door mainly acquires an image of an area behind the vehicle 12100. The imaging unit 12105 provided in the upper part of the windshield in the passenger compartment is mainly used to detect a preceding vehicle or a pedestrian, an obstacle, a traffic light, a traffic sign, a lane, or the like.

Note that FIG. 13 illustrates an example of capturing ranges of the imaging units 12101 to 12104. An imaging range 12111 indicates an imaging range of the imaging unit 12101 provided on the front nose, imaging ranges 12112 and 12113 indicate imaging ranges of the imaging units 12102 and 12103 provided on the side mirrors, respectively, and an imaging range 12114 indicates an imaging range of the imaging unit 12104 provided on the rear bumper or the back door. For example, a bird's-eye view image of the vehicle 12100 viewed from above can be obtained by superimposing image data captured by the imaging units 12101 to 12104.

At least one of the imaging units 12101 to 12104 may have a function of acquiring distance information. For example, at least one of the imaging units 12101 to 12104 may be a stereo camera including a plurality of imaging elements, or may be an imaging element having pixels for phase difference detection.

For example, the microcomputer 12051 obtains a distance to each three-dimensional object within the imaging ranges 12111 to 12114 and a temporal change in the distance (relative speed with respect to the vehicle 12100) based on the distance information obtained from the imaging units 12101 to 12104, and thus, can particularly extract, as a vehicle ahead, a three-dimensional object closest on a path of travel of the vehicle 12100 and traveling at a predetermined speed (for example, 0 km/h or faster) in substantially the same direction as that of the vehicle 12100. Further, the microcomputer 12051 can set an inter-vehicle distance to be secured in advance behind the vehicle ahead, and perform automatic brake control (including follow-up stop control), automatic acceleration control (including follow-up start control), and the like. In this manner, it is possible to perform the cooperative control for the purpose of automated driving or the like for autonomous traveling without depending on the driver's operation.

For example, the microcomputer 12051 classifies three-dimensional object data relating to a three-dimensional object into a two-wheeled vehicle, a standard sized vehicle, a large sized vehicle, a pedestrian, and other three-dimensional objects such as a utility pole, and extracts the data for use in automatic avoidance of an obstacle on the basis of the distance information obtained from the imaging units 12101 to 12104. For example, the microcomputer 12051 distinguishes obstacles in the vicinity of the vehicle 12100 as an obstacle that can be visually recognized by the driver of the vehicle 12100 or an obstacle that is difficult to be visually recognized by the driver. Then, the microcomputer 12051 determines a collision risk indicating the degree of risk of collision with each obstacle, and can perform driver assistance to avoid the collision in a situation where there is a possibility of the collision with the collision risk equal to or higher than a set value by outputting an alarm to the driver via the audio speaker 12061 and/or the display unit 12062 or performing forced deceleration or evasive steering via the drive system control unit 12010.

At least one of the imaging units 12101 to 12104 may be an infrared camera that detects infrared light. For example, the microcomputer 12051 can recognize a pedestrian by determining whether the pedestrian is present in images captured by the imaging units 12101 to 12104. Such pedestrian recognition is performed by a procedure of extracting feature points in the images captured by the imaging units 12101 to 12104, which are infrared cameras, for example, and a procedure of performing pattern matching on a series of feature points indicating an outline of an object and determining whether the object corresponds to the pedestrian. When the microcomputer 12051 determines that the pedestrian is present in the images captured by the imaging units 12101 to 12104 and recognizes the pedestrian, the sound-image output unit 12052 controls the display unit 12062 such that a rectangular contour for emphasis is superimposed and displayed on the recognized pedestrian. In addition, the sound-image output unit 12052 may also control the display unit 12062 to display an icon or the like indicating the pedestrian at a desired position.

An example of the vehicle control system to which the technology according to the present disclosure can be applied has been described above. The technology according to the present disclosure can be applied to the imaging units 12101 to 12105 among the configurations described above. Specifically, the imaging elements to which the semiconductor devices (ROIC substrates) according to the first to fourth embodiments (including the modifications) are applied can be applied as the imaging units 12101 to 12105. Since the highly reliable imaging elements evaluated as described above can be used as the imaging units 12101 to 12105, for example, the pedestrian can be recognized with a high reliability.

Other Application Example 2

The technology according to the present disclosure (the present technology) may be applied not only to the above-described electronic device and vehicle control system but also, for example, to an endoscopic surgery system.

FIG. 14 is a diagram illustrating an example of a schematic configuration of the endoscopic surgery system to which the technology according to the present disclosure (the present technology) can be applied.

FIG. 14 illustrates a state where a surgeon (doctor) 11131 performs surgery on a patient 11132 on a patient bed 11133 using an endoscopic surgery system 11000. As illustrated, the endoscopic surgery system 11000 includes an endoscope 11100, other surgical tools 11110, such as a pneumoperitoneum tube 11111 and an energy treatment tool 11112, a support arm device 11120 that supports the endoscope 11100, and a cart 11200 equipped with various devices for endoscopic surgery.

The endoscope 11100 includes a lens barrel 11101 in which a region having a predetermined length from a distal end is inserted into a body cavity of the patient 11132 and a camera head 11102 connected to a proximal end of the lens barrel 11101. In the illustrated example, the endoscope 11100 configured as a so-called rigid mirror having the rigid lens barrel 11101 is illustrated, but the endoscope 11100 may be configured as a so-called flexible mirror having a flexible lens barrel.

The distal end of the lens barrel 11101 is provided with an opening in which an objective lens has been fitted. A light source device 11203 is connected to the endoscope 11100, and light generated by the light source device 11203 is guided to the distal end of the lens barrel by a light guide extending inside the lens barrel 11101 and is emitted toward an observation target in the body cavity of the patient 11132 through the objective lens. Note that the endoscope 11100 may be a direct-viewing endoscope, or may be an oblique-viewing endoscope or a side-viewing endoscope.

An optical system and an imaging element are provided inside the camera head 11102, and light (observation light) reflected from the observation target is collected on the imaging element by the optical system. The observation light is photoelectrically converted by the imaging element so that an electrical signal corresponding to the observation light, that is, an image signal corresponding to an observation image is generated. The image signal is transmitted to a camera control unit (CCU) 11201 as RAW data.

The CCU 11201 is configured using a central processing unit (CPU), a graphics processing unit (GPU), or the like, and integrally controls the operations of the endoscope 11100 and a display device 11202. Further, the CCU 11201 receives an image signal from the camera head 11102 and performs various types of image processing to display an image based on the image signal, such as development processing (demosaic processing), on the image signal.

The display device 11202 displays an image based on the image signal processed by the CCU 11201 under the control of the CCU 11201.

The light source device 11203 is configured using, for example, a light source such as a light emitting diode (LED), and supplies irradiation light at the time of capturing a surgical site or the like to the endoscope 11100.

An input device 11204 is an input interface with respect to the endoscopic surgery system 11000. A user can input various types of information and input instructions to the endoscopic surgery system 11000 via the input device 11204. For example, the user inputs an instruction and the like to change an imaging condition (a type of irradiation light, a magnification, a focal length, or the like) of the endoscope 11100.

A treatment tool control device 11205 controls driving of the energy treatment tool 11112 configured for ablation of a tissue, incision, sealing of a blood vessel, and the like. A pneumoperitoneum device 11206 delivers a gas into the body cavity through the pneumoperitoneum tube 11111 to inflate the body cavity of the patient 11132 for the purpose of securing the field of view for the endoscope 11100 and securing a work space of the surgeon. A recorder 11207 is a device that can record various types of information related to surgery. A printer 11208 is a device capable of printing various types of information related to surgery in various formats such as text, an image, and a graph.

Note that the light source device 11203 that supplies the irradiation light to the endoscope 11100 at the time of capturing the surgical site can be configured using, for example, an LED, a laser light source, or a white light source configured using a combination thereof. When the white light source is configured using a combination of RGB laser light source, the output intensity and output timing of each color (each wavelength) can be controlled with high accuracy, and as a result, the white balance of a captured image can be adjusted by the light source device 11203. In addition, in this case, an observation target is irradiated with laser light from each of the RGB laser light sources in a time-division manner, and driving of the imaging element of the camera head 11102 is controlled in synchronization with the irradiation timing, so that it is also possible to capture images corresponding to R, G, and B in a time-division manner. According to this method, a color image can be obtained without providing a color filter on the imaging element.

In addition, the driving of the light source device 11203 may be controlled so as to change the intensity of output light at predetermined time intervals. When images are acquired in a time-division manner by controlling the driving of the imaging element of the camera head 11102 in synchronization with the timing of the change of the light intensity and the images are combined, it is possible to generate an image having a high dynamic range without so-called blackout and whiteout.

In addition, the light source device 11203 may be configured to be capable of supplying light in a predetermined wavelength band corresponding to special light observation. The special light observation performs so-called narrow band imaging that captures a predetermined tissue, such as a blood vessel in a mucosal surface layer, with high contrast by using, for example, the wavelength dependence of light absorption in a body tissue and emitting light in a narrower band than irradiation light (that is, white light) at the time of normal observation. Alternatively, the special light observation may perform fluorescence observation that obtains an image by fluorescence generated by emitting excitation light. The fluorescence observation can observe fluorescence from a body tissue by emitting the excitation light to the body tissue (autofluorescence observation), obtain a fluorescent image by performing local injection of a reagent such as indocyanine green (ICG) into a body tissue and emitting excitation light corresponding to a fluorescence wavelength of the reagent to the body tissue, or the like. The light source device 11203 may be configured to be capable of supplying narrowband light and/or excitation light compatible with such special light observation.

Figure 15:
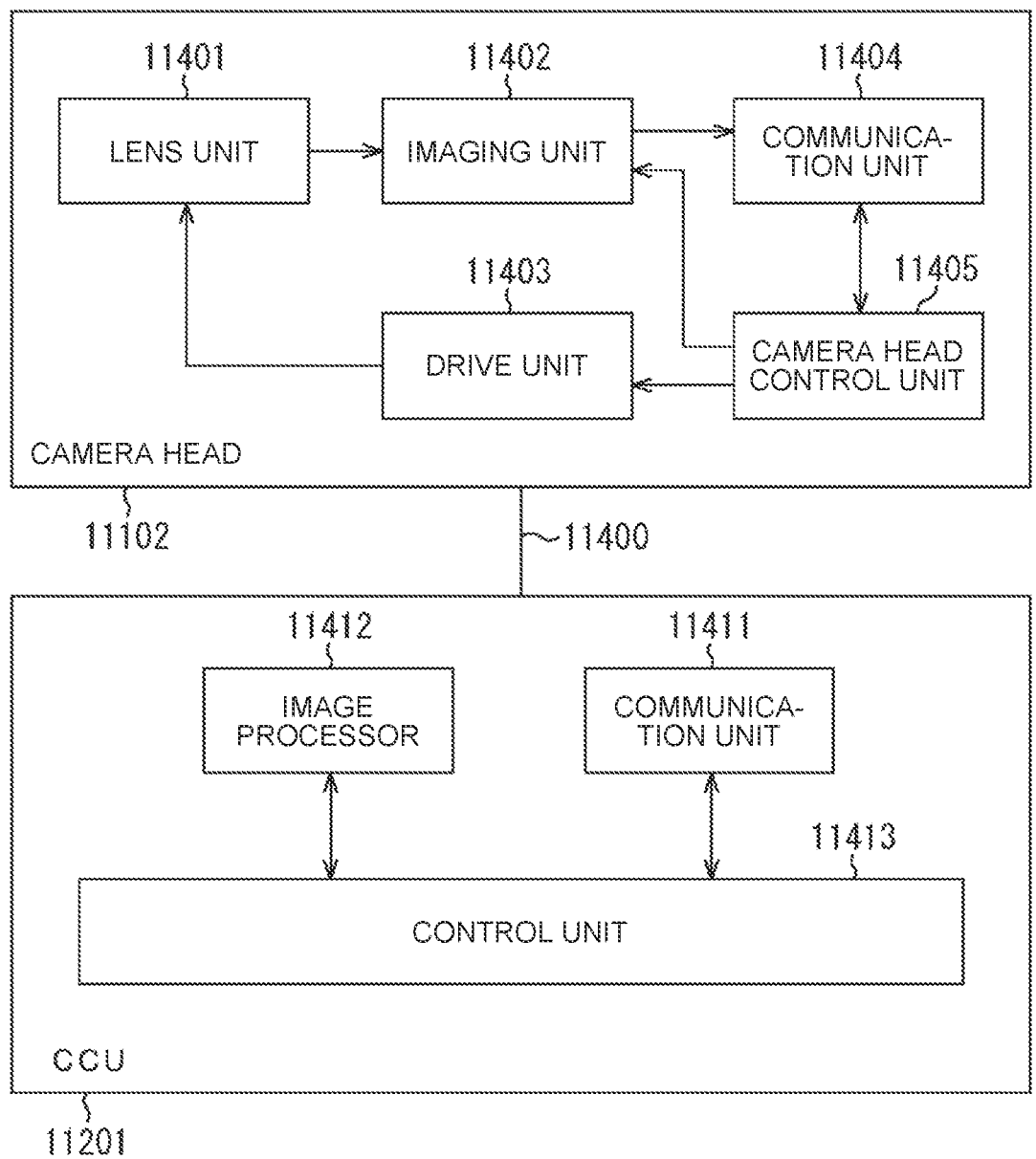
FIG. 15 is a block diagram illustrating an example of a functional configuration of a camera head and a CCU.

FIG. 15 is a block diagram illustrating an example of functional configurations of the camera head 11102 and the CCU 11201 illustrated in FIG. 14.

The camera head 11102 includes a lens unit 11401, an imaging unit 11402, a drive unit 11403, a communication unit 11404, and a camera head control unit 11405. The CCU 11201 has a communication unit 11411, an image processor 11412, and a control unit 11413. The camera head 11102 and the CCU 11201 are connected via a transmission cable 11400 to be capable of performing communication with each other.

The lens unit 11401 is an optical system provided at a connection portion with the lens barrel 11101. Observation light taken in from the distal end of the lens barrel 11101 is guided to the camera head 11102 and incident on the lens unit 11401. The lens unit 11401 is configured by combining a plurality of lenses including a zoom lens and a focus lens.

The imaging unit 11402 is configured using an imaging element. The imaging element forming the imaging unit 11402 may be one (a so-called single plate type) or plural (a so-called multi-plate type) in number. When the imaging unit 11402 is of the multi-plate type, for example, image signals corresponding to R, G, and B may be generated by the respective imaging elements and combined to obtain a color image. Alternatively, the imaging unit 11402 may include a pair of imaging elements configured to acquire right-eye and left-eye image signals compatible with three-dimensional (3D) display. The 3D display enables the surgeon 11131 to more accurately grasp the depth of a living tissue in a surgical site. Note that a plurality of the lens units 11401 corresponding to the imaging elements can be provided when the imaging unit 11402 is of the multi-plate type.

In addition, the imaging unit 11402 is not necessarily provided on the camera head 11102. For example, the imaging unit 11402 may be provided inside the lens barrel 11101 immediately behind the objective lens.

The drive unit 11403 is configured using an actuator, and moves the zoom lens and the focus lens of the lens unit 11401 by a predetermined distance along an optical axis under the control of the camera head control unit 11405. As a result, the magnification and the focus of an image captured by the imaging unit 11402 can be adjusted as appropriate.

The communication unit 11404 is configured using a communication device for transmission and reception of various types of information to and from the CCU 11201. The communication unit 11404 transmits an image signal obtained from the imaging unit 11402 as RAW data to the CCU 11201 via the transmission cable 11400.

In addition, the communication unit 11404 receives a control signal to control driving of the camera head 11102 from the CCU 11201, and supplies the control signal to the camera head control unit 11405. Examples of the control signal include information associated with imaging conditions such as information to specify a frame rate of a captured image, information to specify an exposure value at the time of capturing, and/or information to specify the magnification and focus of a captured image.

Note that the above imaging conditions such as the frame rate, the exposure value, the magnification, and the focus may be specified by a user as appropriate, or may be set automatically by the control unit 11413 of the CCU 11201 based on the acquired image signal. In the latter case, so-called auto exposure (AE) function, auto focus (AF) function, and auto white balance (AWB) function are installed in the endoscope 11100.

The camera head control unit 11405 controls driving of the camera head 11102 based on the control signal from the CCU 11201 received via the communication unit 11404.

The communication unit 11411 is configured using a communication device for transmission and reception of various types of information to and from the camera head 11102. The communication unit 11411 receives an image signal transmitted from the camera head 11102 via the transmission cable 11400.

In addition, the communication unit 11411 transmits a control signal to control driving of the camera head 11102 to the camera head 11102. The image signal and the control signal can be transmitted by telecommunication, optical communication, or the like.

The image processor 11412 performs various types of image processing on the image signal which is the RAW data transmitted from the camera head 11102.

The control unit 11413 performs various types of control related to capturing of a surgical site or the like by the endoscope 11100 and display of a captured image obtained by the capturing of the surgical site or the like. For example, the control unit 11413 generates a control signal to control driving of the camera head 11102.

In addition, the control unit 11413 causes the display device 11202 to display a captured image including a surgical site or the like based on an image signal subjected to image processing by the image processor 11412. At this time, the control unit 11413 may recognize various objects in the captured image using various image recognition techniques. For example, the control unit 11413 can recognize a surgical tool such as a forceps, a specific body site, bleeding, mist at the time of using the energy treatment tool 11112, and the like by detecting a shape, a color, or the like of an edge of an object included in the captured image. When causing the display device 11202 to display the captured image, the control unit 11413 may use a result of the recognition to superimpose various types of surgical support information on the image of the surgical site. Since the surgical support information is superimposed and presented to the surgeon 11131, it is possible to mitigate the burden on the surgeon 11131 and to allow the surgeon 11131 to reliably proceed with surgery.

The transmission cable 11400 that connects the camera head 11102 and the CCU 11201 is an electric signal cable compatible with communication of an electrical signal, an optical fiber compatible with optical communication, or a composite cable thereof.

Here, the communication is performed in a wired manner using the transmission cable 11400 in the illustrated example, but the communication between the camera head 11102 and the CCU 11201 may be performed wirelessly.

An example of the endoscopic surgery system to which the technology according to the present disclosure can be applied has been described above. The technology according to the present disclosure can be applied to the imaging unit 11402 of the camera head 11102 among the configurations described above. Specifically, the imaging elements to which the semiconductor devices (ROIC substrates) according to the first to fourth embodiments (including the modifications) are applied can be used as the imaging unit 11402. Since the highly reliable imaging elements evaluated as described above can be used as the imaging unit 11402, for example, the observation target in the patient cavity can be observed with a high reliability.

Note that the endoscopic surgery system has been described here as an example, but the technology according to the present disclosure may be applied to, for example, a microscopic surgery system or the like.

In addition, the application of the technology according to the present disclosure (the present technology) to the electronic device as the imaging device or the moving object (specifically, the above-described vehicle control system) has been exemplified as described above, but the present technology can also be used in fields such as medical diagnosis, agricultural product inspection, and remote monitoring.

Note that various effects achieved by the semiconductor device and the imaging element according to the embodiments of the present disclosure have been described in the above description, but such effects do not limit the semiconductor device and the imaging element of the present disclosure. In addition, not all of the various effects may be exhibited. In addition, additional effects not described herein may be exhibited by the semiconductor device and imaging element of the present disclosure.

Note that the present disclosure can also have the following configurations.

(1)

A semiconductor device comprising:
a first charge accumulation unit capable of accumulating a charge;
a first initialization unit that is connected to the first charge accumulation unit and initializes the first charge accumulation unit; and
a first voltage switching unit that is connected to the first initialization unit and is capable of selectively supplying a first voltage and a second voltage different from the first voltage to the first initialization unit.

(2)

The semiconductor device according to (1), further comprising:
a first wiring that supplies the first voltage to the first voltage switching unit; and
a second wiring that supplies the second voltage to the first voltage switching unit.

(3)

The semiconductor device according to (2), further comprising
a third wiring connected to the first initialization unit,
wherein the first voltage switching unit selectively supplies the first voltage and the second voltage to the first initialization unit by selectively connecting the first wiring and the second wiring to the third wiring.

(4)

The semiconductor device according to (2), further comprising
a third wiring connected to the first initialization unit,
wherein the first voltage switching unit includes:
a first switching switch provided between the first wiring and the third wiring; and
a second switching switch that is provided between the second wiring and the third wiring and is alternately switchable with the first switching switch.

(5)

The semiconductor device according to (4), wherein
the first voltage switching unit further includes a three switching switch that is provided between the second wiring and the third wiring and is switchable in synchronization with the second switching switch.

(6)

The semiconductor device according to (1), further comprising:
a second charge accumulation unit capable of accumulating a charge to be transferred to the first charge accumulation unit; and
a second initialization unit that is connected to the second charge accumulation unit and initializes the second charge accumulation unit,
wherein the first voltage switching unit is capable of selectively supplying the first voltage and the second voltage to the second initialization unit in addition to the first initialization unit.

(7)

The semiconductor device according to (6), further comprising a switch unit that controls connection between the first charge accumulation unit and the second charge accumulation unit.

(8)

The semiconductor device according to (1), further comprising
a first analog-to-digital conversion unit that is arranged in a second region and is configured to receive an input of a signal based on a charge accumulated in the first charge accumulation unit through a signal line and perform analog-to-digital conversion of the input signal,
wherein the first charge accumulation unit is arranged in a first region, and
the first voltage switching unit is provided in a third region between the first region and the second region.

(9)

The semiconductor device according to (8), further comprising:
a second analog-to-digital conversion unit that is arranged in a fourth region at a position symmetrical to the second region with the first region as a center and is configured to receive an input of a signal based on a charge accumulated in the first charge accumulation unit through the signal line and perform analog-to-digital conversion on the input signal; and
a second voltage switching unit that is arranged in a fifth region at a position symmetrical to the third region with the first region as a center, is connected to the first initialization unit, and is capable of selectively supplying a first voltage and a second voltage different from the first voltage to the first initialization unit.

(10)

The semiconductor device according to (9), further comprising:
a second charge accumulation unit capable of accumulating a charge to be transferred to the first charge accumulation unit; and
a second initialization unit that is connected to the second charge accumulation unit and initializes the second charge accumulation unit,
wherein the second voltage switching unit is capable of selectively supplying the first voltage and the second voltage to the second initialization unit in addition to the first initialization unit.

(11)

An imaging element comprising:
a photoelectric conversion unit that receives light and photoelectrically converts the received light to generate a charge;

a first charge accumulation unit capable of accumulating the charge;

a first initialization unit that is connected to the first charge accumulation unit and initializes the first charge accumulation unit; and a voltage switching unit that is connected to the first initialization unit and is capable of selectively supplying a first voltage and a second voltage different from the first voltage to the first initialization unit.

(12)

The imaging element according to (11), wherein the photoelectric conversion unit includes a plurality of pixels which are arrayed in a matrix, receive light, and photoelectrically convert the received light to generate charges, the first charge accumulation unit and the first initialization unit are provided in each of the plurality of pixels, and the voltage switching unit, which is only one, is provided for a plurality of pixels arrayed in one direction among the plurality of pixels.

(13)

The imaging element according to (11), wherein the photoelectric conversion unit is formed on a first substrate, the first charge accumulation unit, the first initialization unit, and the voltage switching unit are formed on a second substrate, and a first electrode, which is formed on a surface of the first substrate facing a light incident surface and is capable of extracting the charge, and a second electrode, which is formed on one surface of the second substrate and is connected to the first charge accumulation unit, are joined.

(14)

An imaging element comprising:

a first charge accumulation unit capable of accumulating a charge;

a first initialization unit that is connected to the first charge accumulation unit and initializes the first charge accumulation unit;

a photoelectric conversion unit that receives light and photoelectrically converts the received light to generate a charge;

a second charge accumulation unit capable of accumulating the charge generated by the photoelectric conversion unit and transferring the accumulated charge to the first charge accumulation unit;

a second initialization unit that is connected to the second charge accumulation unit and initializes the second charge accumulation unit; and a voltage switching unit that is connected to the first initialization unit and the second initialization unit and is capable of selectively supplying a first voltage and a second voltage different from the first voltage to the first initialization unit and the second initialization unit.

(15)

The imaging element according to (13), wherein the photoelectric conversion unit includes a plurality of pixels which are arrayed in a matrix, receive light, and photoelectrically convert the received light to generate charges, the first charge accumulation unit, the second charge accumulation unit, the first initialization unit, and the second initialization unit are provided in each of the plurality of pixels, and the voltage switching unit, which is only one, is provided for a plurality of pixels arrayed in one direction among the plurality of pixels.

(16)

The imaging element according to (14), wherein the photoelectric conversion unit is formed on a first substrate, the first charge accumulation unit, the first initialization unit, the second charge accumulation unit, the second initialization unit, and the voltage switching unit are formed on a second substrate, and a first electrode, which is formed on a surface of the first substrate facing a light incident surface and is capable of extracting the charge, and a second electrode, which is formed on one surface of the second substrate and is connected to the first charge accumulation unit, are joined.

(17)

The imaging element according to (11) or (14), wherein the photoelectric conversion unit contains any one of a compound semiconductor, silicon, germanium, a quantum dot material, and an organic material.

(18)

The imaging element according to (17), wherein the photoelectric conversion unit is formed using a group III-V compound semiconductor.

(19)

The imaging element according to (18), wherein the group III-V compound semiconductor is indium gallium arsenide.

(20)

The imaging element according to (11) or (14), wherein the photoelectric conversion unit is a silicon image sensor.

(21)

The semiconductor device according to (3), wherein the first voltage switching unit includes a first transistor, one of a source and a drain of the first transistor is connected to the first wiring, and a remaining one of the source and the drain is connected to the third wiring.

(22)

The semiconductor device according to (21), wherein the first voltage switching unit includes a second transistor, and one of a source and a drain of the second transistor is connected to the second wiring, and a remaining one of the source and the drain is connected to the third wiring.

(23)

An electronic device comprising:

an optical system;

a photoelectric conversion unit that receives light from the optical system and photoelectrically converts the received light to generate a charge;

a first charge accumulation unit capable of accumulating the charge;

a first initialization unit that is connected to the first charge accumulation unit and initializes the first charge accumulation unit; and a voltage switching unit that is connected to the first initialization unit and is capable of selectively supplying a first voltage and a second voltage different from the first voltage to the first initialization unit.

(24)

An electronic device including:

an optical system;

a first charge accumulation unit capable of accumulating a charge;

a first initialization unit that is connected to the first charge accumulation unit and initializes the first charge accumulation unit;
a photoelectric conversion unit that receives light from the optical system and photoelectrically converts the received light to generate a charge;
a second charge accumulation unit capable of accumulating the charge generated by the photoelectric conversion unit and transferring the accumulated charge to the first charge accumulation unit;
a second initialization unit that is connected to the second charge accumulation unit and initializes the second charge accumulation unit; and
a voltage switching unit that is connected to the first initialization unit and the second initialization unit and is capable of selectively supplying a first voltage and a second voltage different from the first voltage to the first initialization unit and the second initialization unit.

REFERENCE SIGNS LIST 1, 1A, 1B IMAGING ELEMENT
100, 100A, 100B PHOTOELECTRIC CONVERSION UNIT
11 INSULATING LAYER
11A LOWER ELECTRODE
12 CONTACT LAYER
12A DIFFUSION REGION
13, 41 PHOTOELECTRIC CONVERSION FILM
14 UPPER ELECTRODE LAYER
15 TRANSPARENT ELECTRODE LAYER
200, 200A ROIC SUBSTRATE
21 UPPER INSULATING LAYER
21A CONNECTION ELECTRODE
22 LOWER INSULATING LAYER
22A WIRING
22B VIA
23 SILICON LAYER
23N, 23P MOS TRANSISTOR
110 PIXEL ARRAY
111, 111A, 111B, 111C, P PIXEL
LMU, LMD LOAD TRANSISTOR UNIT
CMU, CMD COMPARATOR CIRCUIT UNIT
CNU, CND COUNTER UNIT
CPs STORAGE NODE CAPACITOR
CPf FLOATING DIFFUSION CAPACITOR
CS CURRENT SOURCE
FD FLOATING DIFFUSION LAYER
PD PHOTODIODE
SN STORAGE NODE
Tofg OVERFLOW GATE TRANSISTOR
Ttrg TRANSFER TRANSISTOR
Trst RESET TRANSISTOR
Tamp AMPLIFICATION TRANSISTOR
Tsel SELECTION TRANSISTOR
VSL VERTICAL SIGNAL LINE
L1, L2, $L_{VDR}$ WIRING
$LO_{VDR}$, $LR_{VDR}$ WIRING
R1 ELEMENT REGION
R2 PERIPHERAL REGION
S1 LIGHT INCIDENT SURFACE
S2 JUNCTION SURFACE
60W WIRING LAYER
61 FIRST ELECTRODE
62 FIRST CONTACT LAYER
62A DIFFUSION REGION
60S SEMICONDUCTOR LAYER
64 SECOND CONTACT LAYER
65 SECOND ELECTRODE
65B CONDUCTIVE FILM
66 PASSIVATION FILM
66H OPENING
67 INSULATING FILM
68 BURIED LAYER
69A, 69B INTERLAYER INSULATING FILM
69E, 72E CONTACT ELECTRODE
69ED DUMMY ELECTRODE
70W WIRING LAYER
71 SEMICONDUCTOR SUBSTRATE
72A INTERLAYER INSULATING FILM
72C MULTILAYER WIRING LAYER
72P PAD ELECTRODE
H1, H2 HOLE
R1B OPB REGION
P-TYPE LAYER
43, 44 N-TYPE LAYER
45 ANTIREFLECTION FILM
46 COLOR FILTER
47 ON-CHIP LENS
51 PASSIVATION LAYER
53A, 53B CONNECTION ELECTRODE
54 BUMP ELECTRODE
80 CAPACITIVE ELEMENT
12100 VEHICLE
12000 VEHICLE CONTROL SYSTEM
12001 COMMUNICATION NETWORK
12030 EXTERNAL VEHICLE INFORMATION DETECTION UNIT
12050 INTEGRATED CONTROL UNIT
12051 MICROCOMPUTER
12053 IN-VEHICLE NETWORK I/F
11000 ENDOSCOPIC SURGERY SYSTEM
11100 ENDOSCOPE
11110 SURGICAL TOOL
11111 PNEUMOPERITONEUM TUBE
11112 ENERGY TREATMENT TOOL
11120 SUPPORT ARM DEVICE
11101 LENS BARREL
11102 CAMERA HEAD
11200 CART
11201 CCU
11202 DISPLAY DEVICE
11203 LIGHT SOURCE DEVICE
11204 INPUT DEVICE
11205 TREATMENT TOOL CONTROL DEVICE
11206 PNEUMOPERITONEUM DEVICE
11207 RECORDER
11400 TRANSMISSION CABLE
11401 LENS UNIT
11402 IMAGING UNIT
11403 DRIVE UNIT
11404, 11411 COMMUNICATION UNIT
11405 CAMERA HEAD CONTROL UNIT
11412 IMAGE PROCESSOR
11413 CONTROL UNIT

The invention claimed is:
1. A semiconductor device, comprising:
a first charge accumulation circuit configured to accumulate a first charge;
a first initialization circuit connected to the first charge accumulation circuit, wherein the first initialization circuit is configured to initialize the first charge accumulation circuit;

a first voltage switching circuit connected to the first initialization circuit;
a second charge accumulation circuit configured to:
  accumulate a second charge; and
  transfer the second charge to the first charge accumulation circuit; and
a second initialization circuit connected to the second charge accumulation circuit, wherein
  the second initialization circuit is configured to initialize the second charge accumulation circuit,
  the first voltage switching circuit is configured to selectively supply a first voltage and a second voltage to the first initialization circuit and the second initialization circuit, and
  the second voltage is different from the first voltage.

2. The semiconductor device according to claim 1, further comprising:
a first wiring configured to supply the first voltage to the first voltage switching circuit; and
a second wiring configured to supply that supplies the second voltage to the first voltage switching circuit.

3. The semiconductor device according to claim 2, further comprising a third wiring connected to the first initialization circuit,
wherein the first voltage switching circuit is further configured to selectively supply the first voltage and the second voltage to the first initialization circuit based on connection of each of the first wiring and the second wiring to the third wiring.

4. The semiconductor device according to claim 2, further comprising a third wiring connected to the first initialization circuit,
wherein the first voltage switching circuit includes:
  a first switching switch between the first wiring and the third wiring; and
  a second switching switch between the second wiring and the third wiring, wherein the second switching switch is alternately switchable with the first switching switch.

5. The semiconductor device according to claim 4, wherein
the first voltage switching circuit further includes a three switching switch between the second wiring and the third wiring, and
the three switching switch is switchable in synchronization with the second switching switch.

6. The semiconductor device according to claim 1, further comprising a switch circuit configured to control connection between the first charge accumulation circuit and the second charge accumulation circuit.

7. The semiconductor device according to claim 1, further comprising a first analog-to-digital conversion circuit configured to:
receive a first input signal through a first signal line based on the first charge accumulated in the first charge accumulation; and
perform analog-to-digital conversion of the first input signal, wherein
  the first charge accumulation circuit is in a first region of the semiconductor device,
  the first analog-to-digital conversion circuit is in a second region of the semiconductor device, and
  the first voltage switching circuit is in a third region of the semiconductor device, wherein the third region is between the first region and the second region.

8. The semiconductor device according to claim 7, further comprising:

a second analog-to-digital conversion circuit in a fourth region of the semiconductor device, wherein
  the fourth region is at a position symmetrical to the second region with the first region as a center, and
  the second analog-to-digital conversion circuit is configured to:
    receive a second input signal through a second signal line based on the first charge accumulated in the first charge accumulation circuit; and
    perform analog-to-digital conversion on the second input signal; and
a second voltage switching circuit in a fifth region of the semiconductor device, wherein the fifth region is at a position symmetrical to the third region with the first region as the center, wherein
  the second voltage switching circuit is connected to the first initialization circuit, and
  the second voltage switching circuit is configured to selectively supply the first voltage and the second voltage to the first initialization circuit.

9. The semiconductor device according to claim 8, wherein the second voltage switching circuit is further configured to selectively supply the first voltage and the second voltage to the second initialization circuit.

10. The semiconductor device according to claim 3, wherein
the first voltage switching circuit includes a first transistor,
one of a source of the first transistor or a drain of the first transistor is connected to the first wiring, and
a remaining one of the source of the first transistor or the drain of the first transistor is connected to the third wiring.

11. An imaging element, comprising:
a photoelectric conversion circuit configured to:
  receive light; and
  photoelectrically convert the received light to generate a charge, wherein
    the photoelectric conversion circuit is on a first substrate,
    the photoelectric conversion circuit includes:
      a first electrode configured to extract the charge, wherein the first electrode is on a surface of the first substrate that faces a light incident surface of the photoelectric conversion circuit; and
      a second electrode on a surface of a second substrate, and the first electrode is connected to the second electrode;
a first charge accumulation circuit configured to accumulate the charge, wherein the second electrode is connected to the first charge accumulation circuit;
a first initialization circuit connected to the first charge accumulation circuit, wherein the first initialization circuit is configured to initialize the first charge accumulation circuit; and
a voltage switching circuit connected to the first initialization circuit, wherein the voltage switching circuit is configured to selectively supply a first voltage and a second voltage to the first initialization circuit, wherein the second voltage is different from the first voltage, and
the first charge accumulation circuit, the first initialization circuit, and the voltage switching circuit are on the second substrate.

12. The imaging element according to claim 11, wherein the photoelectric conversion circuit includes a plurality of pixels in a matrix, the plurality of pixels is configured to receive the light, the photoelectric conversion circuit is further configured to photoelectrically convert the received light to generate charges, the charges include the charge, each pixel of the plurality of pixels includes the first charge accumulation circuit and the first initialization circuit, and a set of pixels arrayed in one direction among the plurality of pixels includes the voltage switching circuit.

13. The imaging element according to claim 11, wherein the photoelectric conversion circuit includes one of a compound semiconductor, silicon, germanium, a quantum dot material, or an organic material.

14. The imaging element according to claim 13, wherein the photoelectric conversion circuit further includes a group III-V compound semiconductor.

15. An imaging element, comprising:

a first charge accumulation circuit configured to accumulate a first charge;

a first initialization circuit connected to the first charge accumulation circuit, wherein the first initialization circuit is configured to initialize the first charge accumulation circuit;

a photoelectric conversion circuit configured to:
  receive light; and
  photoelectrically convert the received light to generate a second charge;

a second charge accumulation circuit configured to:
  accumulate the second charge generated by the photoelectric conversion circuit; and
  transfer the second charge to the first charge accumulation circuit;

a second initialization circuit connected to the second charge accumulation circuit, wherein the second initialization circuit is configured to initialize unit and initializes the second charge accumulation circuit; and a voltage switching circuit connected to the first initialization circuit and the second initialization circuit, wherein
  the voltage switching circuit is configured to selectively supply a first voltage and a second voltage to the first initialization circuit and the second initialization circuit, and
  the second voltage is different from the first voltage.

16. The imaging element according to claim 15, wherein the photoelectric conversion circuit includes a plurality of pixels in a matrix, the plurality of pixels is configured to receive the light, the photoelectric conversion circuit is further configured to photoelectrically convert the received light to generate charges, the charges include the second charge, each pixel of the plurality of pixels includes the first charge accumulation circuit, the second charge accumulation circuit, the first initialization circuit, and the second initialization circuit, and a set of pixels arrayed in one direction among the plurality of pixels includes the voltage switching circuit.

17. The imaging element according to claim 15, wherein the photoelectric conversion circuit is on a first substrate, the first charge accumulation circuit, the first initialization circuit, the second charge accumulation circuit, the second initialization circuit, and the voltage switching circuit are on a second substrate, the photoelectric conversion circuit includes:
  a first electrode on a surface of the first substrate that faces a light incident surface of the photoelectric conversion circuit, wherein the first electrode is configured to extract the second charge;
  a second electrode on a surface of the second substrate;
  the second electrode is connected to the first charge accumulation circuit; and
  the first electrode is connected to the second electrode.

18. An electronic device, comprising:

an optical system;

a photoelectric conversion circuit configured to:
  receive light from the optical system; and
  photoelectrically convert the received light to generate a first charge;

a first charge accumulation circuit configured to accumulate the first charge;

a first initialization circuit connected to the first charge accumulation circuit, wherein the first initialization circuit is configured to initialize the first charge accumulation circuit;

a voltage switching circuit connected to the first initialization circuit;

a second charge accumulation circuit configured to:
  accumulate a second charge; and
  transfer the second charge to the first charge accumulation circuit; and a second initialization circuit connected to the second charge accumulation circuit, wherein
  the second initialization circuit is configured to initialize the second charge accumulation circuit,
  the voltage switching circuit is configured to selectively supply a first voltage and a second voltage to the first initialization circuit and the second initialization circuit, and
  the second voltage is different from the first voltage.

* * * * *